(12) United States Patent
Kiyotoshi

(10) Patent No.: US 8,178,875 B2
(45) Date of Patent: May 15, 2012

(54) NONVOLATILE MEMORY DEVICE AND METHOD FOR MANUFACTURING SAME

(75) Inventor: Masahiro Kiyotoshi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/435,115

(22) Filed: May 4, 2009

(65) Prior Publication Data
US 2009/0289251 A1 Nov. 26, 2009

(30) Foreign Application Priority Data
May 22, 2008 (JP) ................. 2008-134208

(51) Int. Cl.
H01L 29/06 (2006.01)

(52) U.S. Cl. .............. 257/41; 257/43; 257/E21.068; 257/E25.018; 438/100; 438/104

(58) Field of Classification Search ............ 257/41, 257/43, E21.068, E25.018; 438/100, 104
See application file for complete search history.

(56) References Cited

U.S. PATENT DOCUMENTS

| 7,202,126 | B2 | 4/2007 | Kiyotoshi | |
|---|---|---|---|---|
| 7,943,926 | B2* | 5/2011 | Lee et al. ................ | 257/43 |
| 2003/0129813 | A1 | 7/2003 | Lu et al. | |
| 2007/0285963 | A1* | 12/2007 | Toda et al. .............. | 365/148 |
| 2007/0290186 | A1 | 12/2007 | Bourim et al. | |
| 2008/0006907 | A1 | 1/2008 | Lee et al. | |
| 2008/0032481 | A1 | 2/2008 | Kiyotoshi | |
| 2008/0073635 | A1 | 3/2008 | Kiyotoshi et al. | |
| 2009/0032795 | A1* | 2/2009 | Kim et al. .............. | 257/4 |
| 2009/0230556 | A1* | 9/2009 | Mikawa et al. .......... | 257/758 |
| 2009/0262569 | A1* | 10/2009 | Shinozaki ............... | 365/148 |

FOREIGN PATENT DOCUMENTS

| JP | 2005-522045 A | 7/2005 |
|---|---|---|
| JP | 2006-203098 | 8/2006 |
| KR | 10-0350063 | 8/2002 |

OTHER PUBLICATIONS

Notification of Comments issued by the Korean Patent Office on Jan. 13, 2011, for Korean Patent Application No. 10-2009-44524, and English-language translation thereof.

* cited by examiner

Primary Examiner — Trung Q Dang
(74) Attorney, Agent, or Firm — Finnegan, Henderson, Farabow, Garrett & Dunner, L.L.P.

(57) ABSTRACT

A nonvolatile memory device includes a plurality of component memory layers stacked on one another. Each of the plurality of component memory layers includes a first wiring, a second wiring provided non-parallel to the first wiring, and a stacked structure unit provided between the first wiring and the second wiring. The stacked structure unit has a memory layer and a rectifying element. The rectifying element has a Schottky junction formed on an interface between an electrode and an oxide semiconductor. The electrode includes a metal and the oxide semiconductor includes a metal.

19 Claims, 20 Drawing Sheets

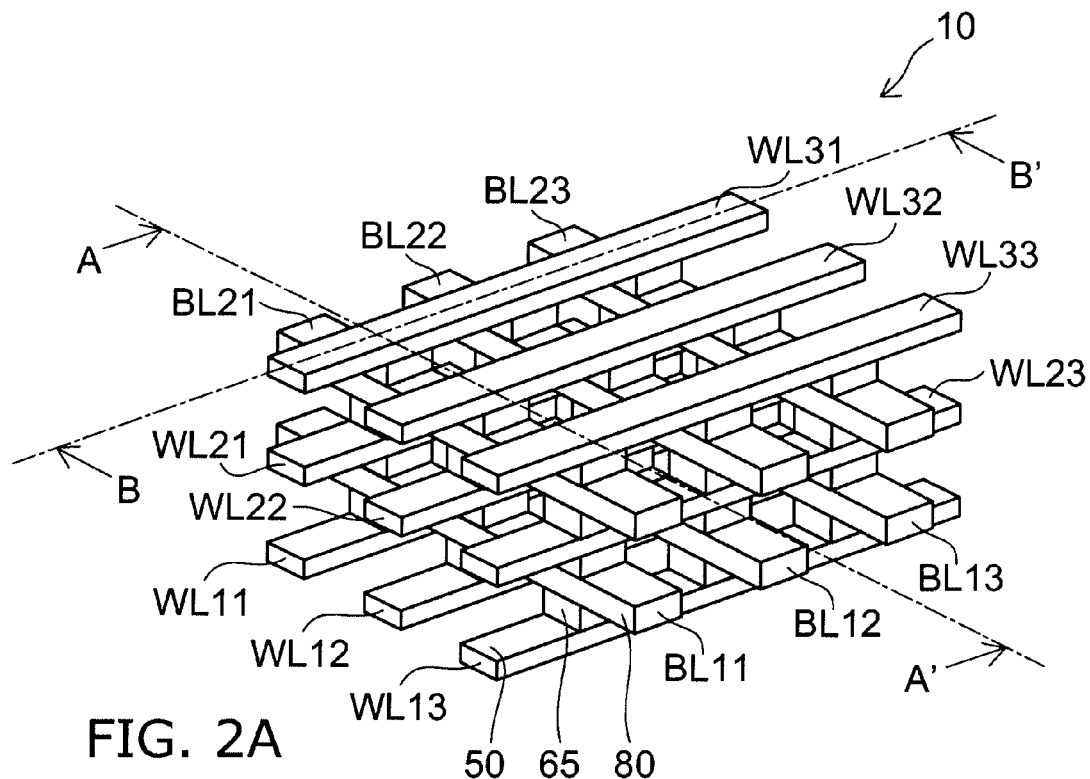
FIG. 2A
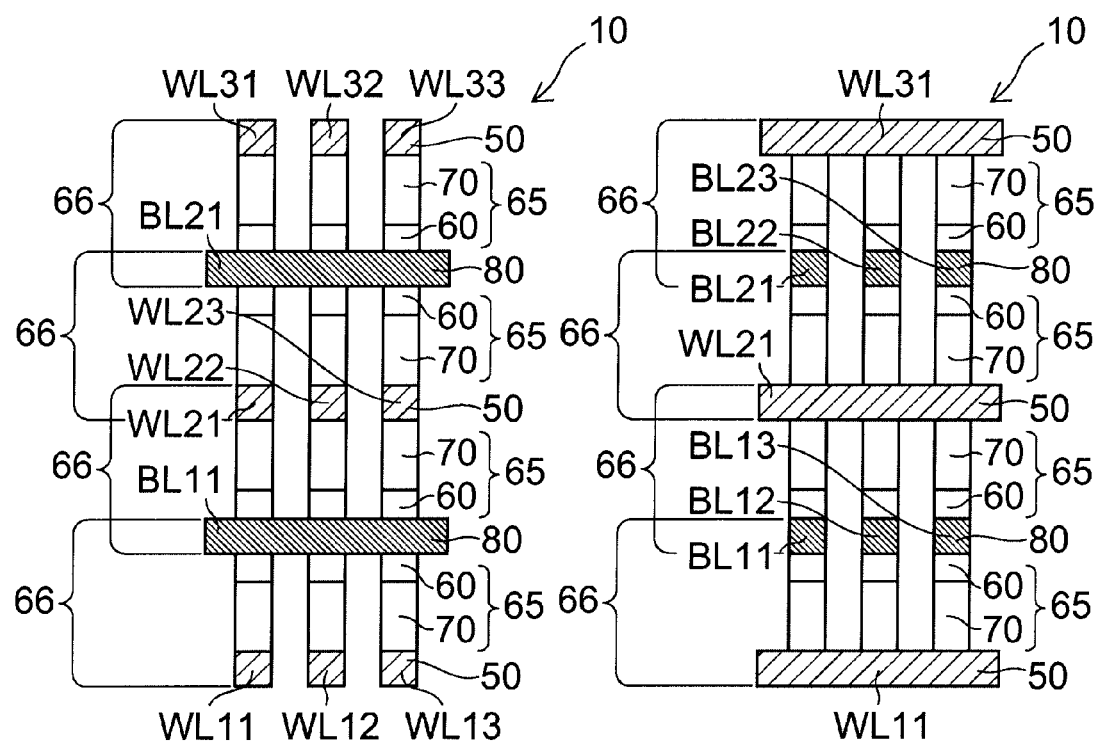
FIG. 2B
FIG. 2C

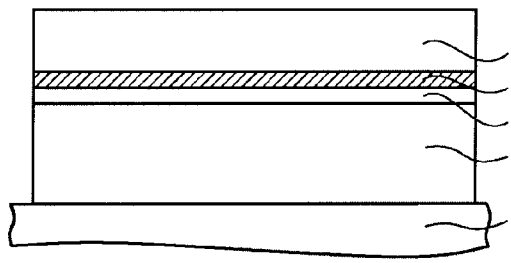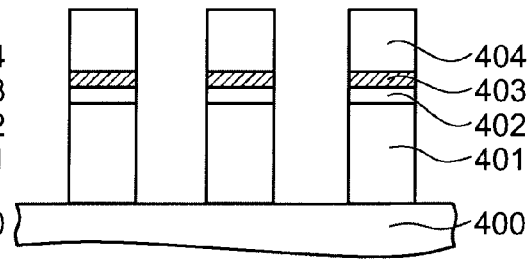
FIG. 18A  FIG. 18B
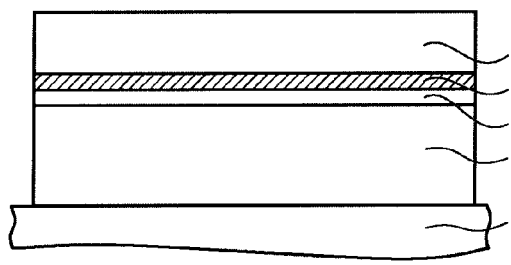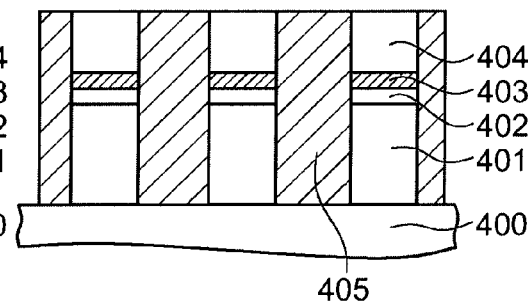
FIG. 19A  FIG. 19B

BIT LINE DIRECTION

WORD LINE DIRECTION

BIT LINE DIRECTION

WORD LINE DIRECTION

NONVOLATILE MEMORY DEVICE AND METHOD FOR MANUFACTURING SAME

CROSS-REFERENCE TO RELATED APPLICATIONS

This application is based upon and claims the benefits of priority from the prior Japanese Patent Application No. 2008-134208, filed on May 22, 2008; the entire contents of which are incorporated herein by reference.

BACKGROUND OF THE INVENTION

1. Field of the Invention

The present invention relates to a nonvolatile memory device and a method for manufacturing the same.

2. Background Art

Nonvolatile memory typified by NAND flash memory is used widely for large-capacity data storage in mobile telephones, digital still cameras, USB memory, silicon audio, and the like. The market continues to grow due to the reduction of manufacturing costs per bit enabled by rapid downsizing. However, NAND flash memory utilizes a transistor operation that records information using a threshold shift. It is considered that improvements to uniformity of characteristics, reliability, higher-speed operations, and higher bit density will reach a limit. The development of a new nonvolatile memory is desirable.

On the other hand, for example, phase change memory or variable resistance memory operates by utilizing a variable resistance state of a resistive material. Therefore, a transistor operation is unnecessary during writing/erasing, and the element characteristics improve as the size of the resistive material is reduced. Hence, this technology is expected to respond to future needs by realizing highly uniform characteristics, higher reliability, higher-speed operations, and higher bit density.

A variable resistance memory is different from conventional NAND flash memory in that sensing is performed by a current amount. To this end, a rectifying element (diode) is provided in each memory cell to regulate the direction of the current flowing in a memory layer having a variable resistance state.

The rectifying element is normally formed by a PIN diode having good affinity with silicon devices. However, the following problems occur. It is necessary to form polycrystalline silicon, for example, having three portions of a p-type, a non-doped (intrinsic semiconductor) type, and an n-type. It is also necessary to activate impurities, and therefore the number of process steps increases. Increasing the layer thickness of the non-doped layer to secure the breakdown voltage increases the overall thickness to increase and the differences in levels between cell portion and peripheral circuit portion; and manufacturing becomes difficult. Further, the impurity profile in the PIN layer readily changes during thermal steps after formation of the PIN layer, making it difficult to provide uniform characteristics of PIN diodes in each layer of a stacked nonvolatile memory device. The constraints of the heating steps when forming the PIN diode result in constraints on materials that can be used as wirings. Also, subsequent oxidation processing to remove damage after processing the PIN diode causes oxidation of the wirings and barrier metal, resulting in performance deterioration. In comparison with a Schottky junction, in which majority carriers carry the current, a PIN diode uses a PN junction, in which mainly minority carriers carry the current. Therefore, it is difficult to obtain the necessary operation current for writing and erasing a variable resistance memory, accordingly resulting in elements overheat due to Joule heat. Thus, various problems occur when using a PIN diode as the rectifying element.

JP-A 2005-522045 (Kohyo) discusses technology related to a phase change memory device including a variable resistance element that store information as a resistance value determined by a crystalline phase change and a Schottky diode. However, materials forming the Schottky diode are not examined; and by conventional art, for example, materials of the rectifying element and materials of the memory layer may react to cause, for example, deterioration of characteristics of the rectifying element and/or the memory layer; and integration of the rectifying element and the memory layer is difficult. Further, materials of the rectifying element may react with each other, causing deterioration of characteristics of the rectifying element. Additionally, for a stacked nonvolatile memory device, the manufacturing step history is different for each of the layers stacked on one another, and therefore the manufacturing step history is different for the rectifying elements of each layer. Therefore, for example, differences in thermal histories may result in different characteristics among layers of rectifying elements, and uniform rectifying properties cannot be obtained.

SUMMARY OF THE INVENTION

According to an aspect of the invention, there is provided a nonvolatile memory device including a plurality of component memory layers stacked on one another, each of the plurality of component memory layers including: a first wiring; a second wiring provided non-parallel to the first wiring; and a stacked structure unit provided between the first wiring and the second wiring, the stacked structure unit having a memory layer and a rectifying element; the rectifying element having a Schottky junction formed on an interface between an electrode and an oxide semiconductor, the electrode including a metal, the oxide semiconductor including a metal.

According to another aspect of the invention, there is provided a method for manufacturing a nonvolatile memory device, the device including a plurality of component memory layers multiply stacked on one another, the component memory layer including a first wiring, a second wiring provided non-parallel to the first wiring, and a stacked structure unit provided between the first wiring and the second wiring, the stacked structure unit including a memory layer and a rectifying element, the method including: forming a first conductive film serving as the first wiring on a semiconductor substrate; forming a memory layer film serving as the memory layer; forming an electrode film serving as an electrode of the rectifying element; forming an oxide semiconductor film serving as an oxide semiconductor of the rectifying element; forming a second conductive film serving as the second wiring; forming the first wiring by processing the first conductive film into a band configuration aligning in a first direction; and forming the second wiring by processing the second conductive film into a band configuration aligning in a second direction non-parallel to the first direction, at least one of the forming the first wiring and the forming the second wiring processing the memory layer film, the electrode film, and the oxide semiconductor film into a configuration along one of the first wiring and the second wiring.

According to another aspect of the invention, there is provided a method for manufacturing a nonvolatile memory device, the device including a plurality of component memory layers multiply stacked on one another, the component memory layer including a first wiring, a second wiring provided non-parallel to the first wiring, and a stacked structure unit provided between the first wiring and the second wiring, the stacked structure unit including a memory layer and a rectifying element, the method including: forming a first dielectric film having a first trench provided on a semiconductor substrate and filling a first conductive film into the first trench, the first conductive film serving as the first wiring; forming a memory layer film serving as the memory layer; forming an electrode film serving as an electrode of the rectifying element, and an oxide semiconductor film serving as an oxide semiconductor of the rectifying element; collectively processing the memory layer film, the electrode film, and the oxide semiconductor film into a columnar configuration; and filling an inter-layer dielectric film between the memory layer film, the electrode film, and the oxide semiconductor film being collectively processed, forming a second dielectric film having a second trench above the memory layer film, the electrode film, the oxide semiconductor film, and the inter-layer dielectric film, and filling a second conductive film into the second trench, the second conductive film serving as the second wiring.

BRIEF DESCRIPTION OF THE DRAWINGS

FIGS. 2A to 2C are schematic views illustrating a configuration of the nonvolatile memory device according to the first embodiment of the present invention;

FIGS. 18A and 18B are schematic cross-sectional views in order of the steps, illustrating the method for manufacturing the nonvolatile memory device according to the third example of the present invention;

FIGS. 19A and 19B are schematic cross-sectional views in order of the steps continuing from FIG. 18B;

DETAILED DESCRIPTION OF THE INVENTION

Figure 1:
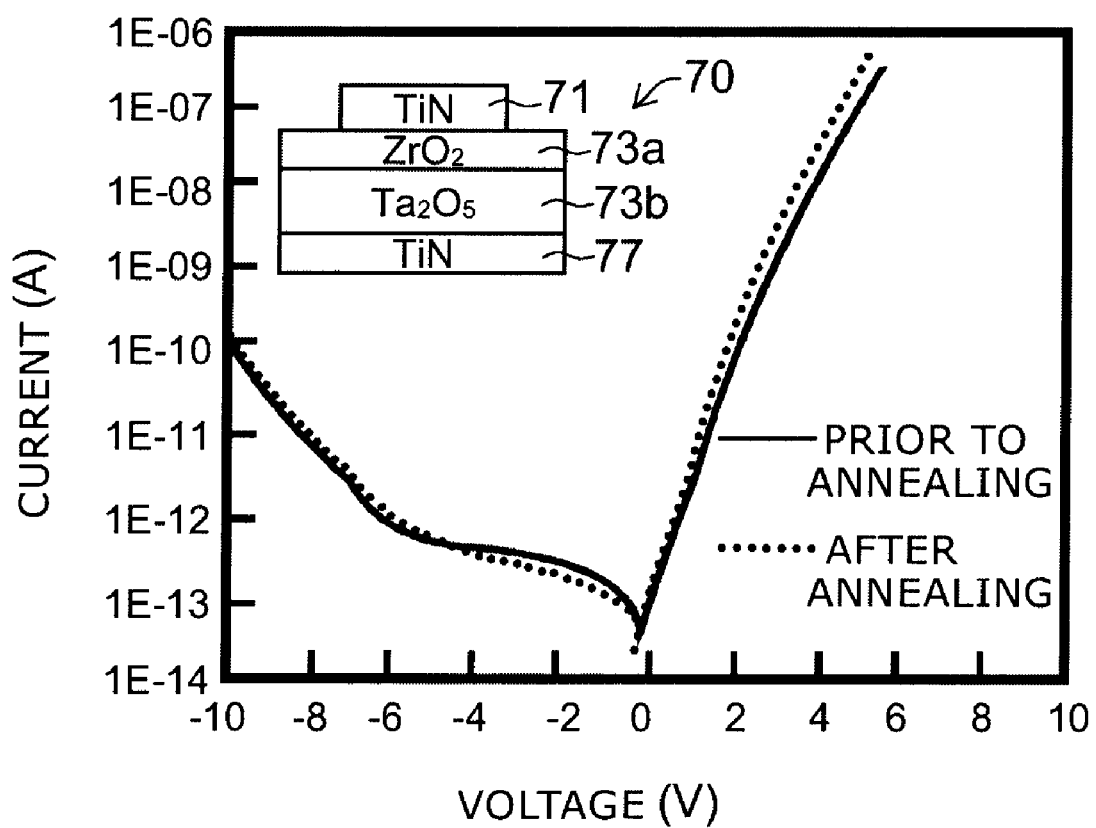
FIG. 1 is a schematic view illustrating a configuration and characteristics of a main component of a nonvolatile memory device according to a first embodiment of the present invention.

Hereinbelow, embodiments of the present invention are described in detail with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic view illustrating a configuration and characteristics of a main component of a nonvolatile memory device according to a first embodiment of the present invention.

Namely, FIG. 1 illustrates the configuration of a rectifying element 70 of a nonvolatile memory device 10 according to this embodiment, and voltage-current characteristics of the rectifying element 70.

FIGS. 2A to 2C are schematic views illustrating a configuration of the nonvolatile memory device according to the first embodiment of the present invention.

Namely, FIG. 2A is a schematic perspective view; FIG. 2B is a cross-sectional view along line A-A' of FIG. 2A; and FIG. 2C is a cross-sectional view along line B-B' of FIG. 2A.

Figure 3:
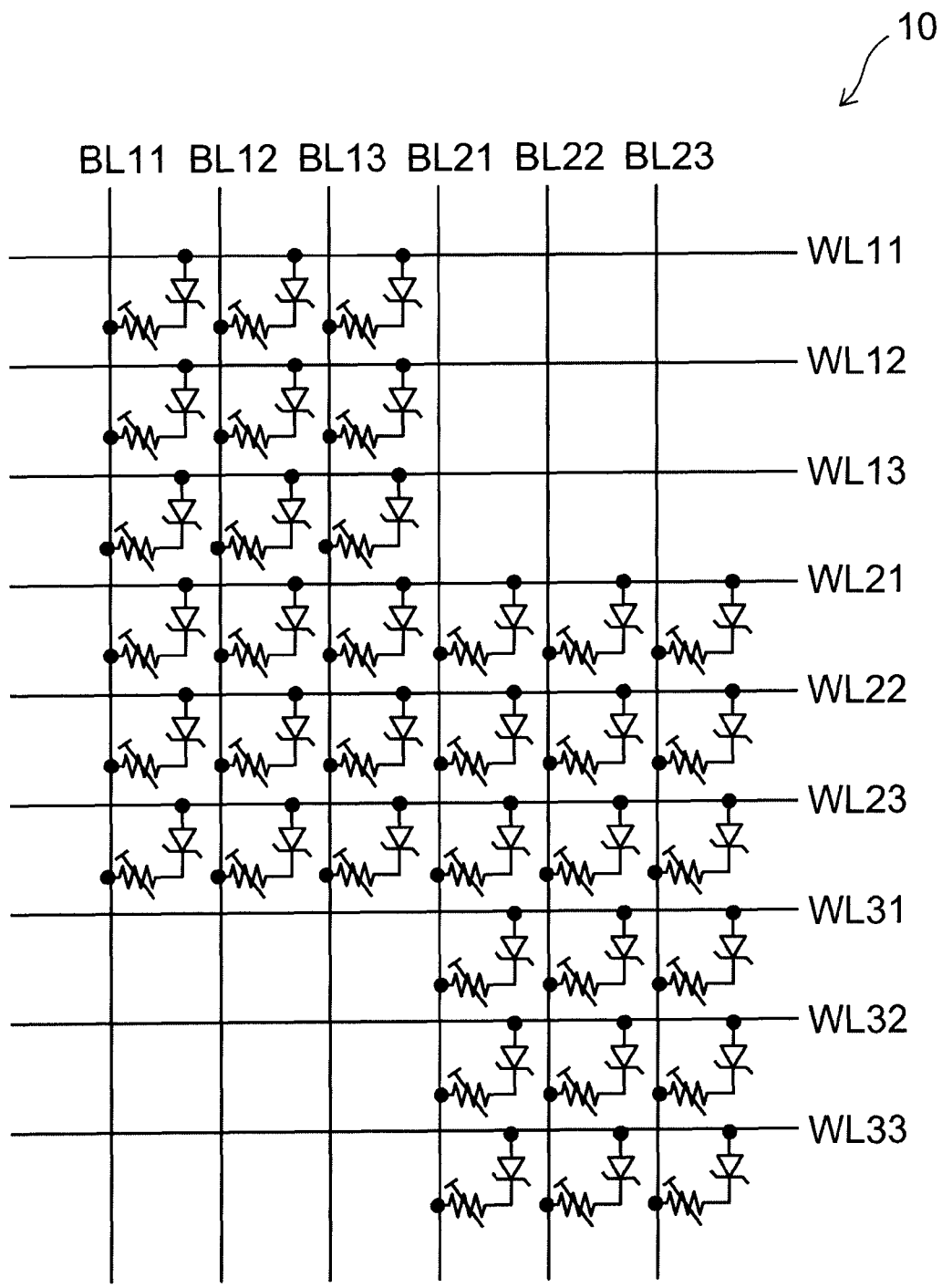
FIG. 3 is a circuit diagram illustrating the configuration of the nonvolatile memory device according to the first embodiment of the present invention.

FIG. 3 is a circuit diagram illustrating the configuration of the nonvolatile memory device according to the first embodiment of the present invention.

Figure 4A:
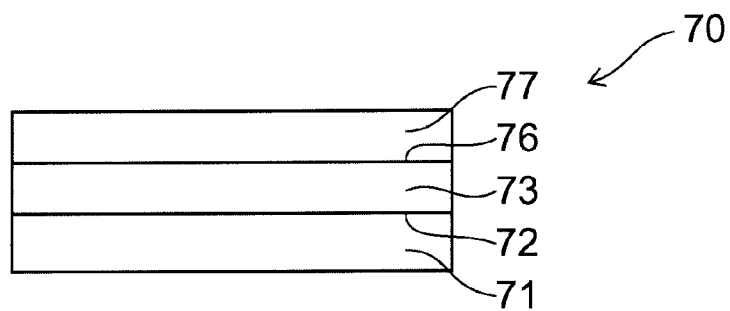
FIGS. 4A and 4B are schematic cross-sectional views illustrating configurations of rectifying elements of the nonvolatile memory device according to the first embodiment of the present invention.
Figure 4B:
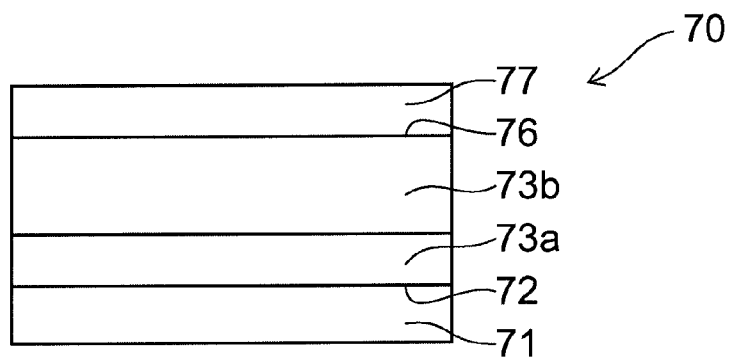

FIGS. 4A and 4B are schematic cross-sectional views illustrating configurations of rectifying elements of the nonvolatile memory device according to the first embodiment of the present invention.

Namely, FIGS. 4A and 4B illustrate configurations of two examples of rectifying elements of the nonvolatile memory device 10 according to this embodiment.

Figure 5:
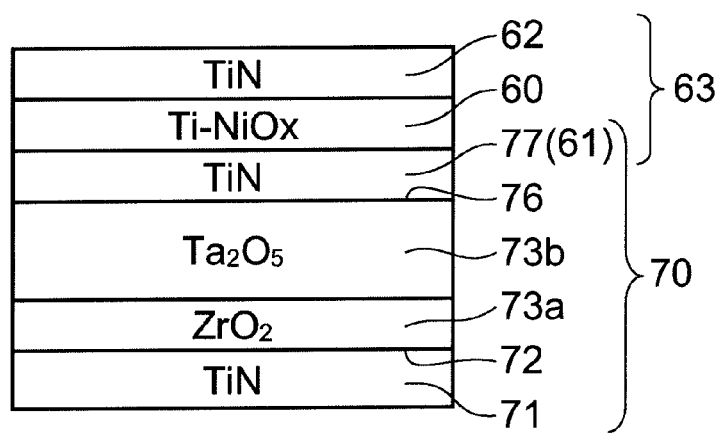
FIG. 5 is a schematic cross-sectional view illustrating another configuration of main components of the nonvolatile memory device according to the first embodiment of the present invention.

FIG. 5 is a schematic cross-sectional view illustrating another configuration of main components of the nonvolatile memory device according to the first embodiment of the present invention.

Namely, FIG. 5 illustrates the configuration of another rectifying element and memory layer of the nonvolatile memory device 10 according to this embodiment.

As illustrated in FIGS. 2A to 2C, the nonvolatile memory device 10 according to the first embodiment of the present invention includes component memory layers 66 multiply stacked on one another, the component memory layer 66 including a first wiring 50, a second wiring 80 provided non-parallel to the first wiring 50, and a stacked structure unit 65 provided between the first wiring 50 and the second wiring 80 and including a memory layer 60 and a rectifying element 70.

For example, in a lowermost component memory layer 66 of the nonvolatile memory device 10, the first wirings 50 are word lines WL11, WL12, and WL13; and the second wirings 80 are bit lines BL11, BL12, and BL13. In a component memory layer 66 second from the bottom, the first wirings 50 are word lines WL21, WL22, and WL23; and the second wirings 80 are bit lines BL11, BL12, and BL13. In a component memory layer 66 third from the bottom, the first wirings 50 are word lines WL21, WL22, and WL23; and the second wirings 80 are bit lines BL21, BL22, and BL23. In an uppermost component memory layer 66 (fourth from the bottom), the first wirings 50 are word lines WL31, WL32, and WL33; and the second wirings 80 are bit lines BL21, BL22, and BL23.

Although the nonvolatile memory device 10 has four component memory layers 66 stacked on one another, the number of component memory layers 66 is arbitrary in the nonvolatile memory device according to this embodiment.

Such a nonvolatile memory device may be provided above a semiconductor substrate. In such a case, the component memory layers 66 may be disposed parallel to a major surface of the semiconductor substrate. In other words, component memory layers may be multiply stacked parallel to the major surface of the semiconductor substrate.

To avoid complexity, FIGS. 2A to 2C illustrate three first wirings 50 (word lines) and three second wirings 80 (bit lines) of each component memory layer 66. However, the number of the first wirings 50 and the number of the second wirings 80 in the nonvolatile memory device 10 according to this embodiment are arbitrary; and the number of the first wirings 50 and the number of the second wirings 80 may be different.

Adjacent component memory layers 66 share first wirings 50 (word lines) and second wirings 80 (bit lines).

Namely, as illustrated in FIGS. 2B and 2C and FIG. 3, the word lines WL21, WL22, and WL23 are shared by the component memory layers above and below; and the bit lines BL11, BL12, and BL13 and the bit lines BL21, BL22, and BL23 are shared by the component memory layers above and below. In other words, word lines and bit lines of a shared bit line/word line structure are shared by component memory layers 66 above and below. However, the present invention is not limited thereto; and word lines and bit lines may be independently provided in each of the stacked component memory layers 66. In the case where word lines and bit lines are independently provided in each component memory layer 66, the aligning direction of the word line and the aligning direction of the bit line may be different for each component memory layer 66.

Here, it is assumed that the first wiring 50 is a word line, and the second wiring 80 is a bit line; but the first wiring 50 may be assumed to be a bit line, and the second wiring 80 may be assumed to be a word line. In other words, the bit line and the word line are mutually interchangeable in the nonvolatile memory device and the method for manufacturing the same according to the embodiments described below. Hereinbelow, the case is described where the first wiring 50 is a word line and the second wiring 80 is a bit line.

In each of the component memory layers 66 illustrated in FIGS. 2B and 2C, the stacked structure unit 65 that includes the memory layer 60 and the rectifying element 70 is provided on a portion (crosspoint) where the first wiring 50 and the second wiring 80 intersect in three dimensions; and the nonvolatile memory device 10 is a so-called crosspoint nonvolatile memory device. The memory layer 60 of each crosspoint is one storage unit; and the stacked structure unit 65 including the memory layer 60 is one cell.

As described below, a recording unit is formed by, for example, providing electrodes (a first conductive layer and a second conductive layer) on one or both sides of the memory layer 60. However, in these drawings, such electrodes are omitted and only the memory layer 60 is illustrated.

Although the rectifying element 70 is provided on the first wiring 50 side and the memory layer 60 (and the recording unit described below) is provided on the second wiring side in the example illustrated in FIGS. 2B and 2C, the memory layer 60 may be provided on the first wiring 50 side, and the rectifying element 70 may be provided on the second wiring side. Further, the stack order of the rectifying element 70 and the memory layer 60 may be different with respect to the first wiring 50 and the second wiring 80 for each component memory layer 66; and thus, the stack order of the rectifying element 70 and the memory layer 60 is arbitrary.

A variable resistance material, in which a resistance changes by a voltage applied to both ends, may be used as the memory layer 60. Such variable resistance materials are often formed by oxides. Furthermore, a chalcogenide phase change material, for example, in which a resistance state changes due to a Joule heat generated by an applied current, may be used as the memory layer 60.

The rectifying element 70 of the nonvolatile memory device 10 according to this embodiment illustrated in FIG. 4A includes a Schottky junction formed at an interface (a Schottky interface 72) between an electrode 71 that includes a metal and an oxide semiconductor 73 that includes a metal. In other words, the rectifying element 70 is a Schottky diode that uses a metal oxide as the semiconductor layer.

Thus, problems are prevented that may occur in the case where, for example, a PIN diode is used as the rectifying element 70, such as an increased number of process steps, increased differences in levels, nonuniformities of diode characteristics due to changes in impurity profiles, constraints on wiring materials, oxidation of wirings and/or barrier metal, variation of characteristics due to differences in the thermal history of multilayered structures, etc.

Restated, the use of a Schottky diode, in which characteristics do not depend on impurity concentrations and activation behavior, as the rectifying element 70 of the nonvolatile memory device 10 resolves problems such as various problems resulting from differences of the integration between wirings, barrier metal, and the like, and the variation of characteristics resulting from differences in the thermal history of multilayered structures. It is thereby possible to increase the bit density by stacking memory cells in a direction perpendicular to the substrate.

Further, the semiconductor layer of the Schottky diode of the nonvolatile memory device 10 uses the oxide semiconductor 73 that includes a metal instead of, for example, a semiconductor layer of silicon. Therefore, in the case where various oxides and materials that have chemical properties similar to oxides are used as the material of the memory layer 60, the risk is reduced that the memory layer 60 and the oxide semiconductor 73 may react. Integration of the rectifying element 70 and the memory layer 60 is thereby easier.

The use of the oxide semiconductor 73 that includes a metal as the Schottky diode semiconductor layer of the nonvolatile memory device 10 enables formation of the oxide semiconductor 73 at a low temperature. Formation is therefore possible at room temperature using, for example, PVD (Physical Vapor Deposition) and the like.

Additionally, even during heating steps after the film formation of the oxide semiconductor 73, the impurity profile (for example, the impurity concentration distribution) does not vary in comparison to that of a semiconductor such as silicon; and characteristics are stable.

In other words, in the case where a semiconductor such as silicon is used as the semiconductor layer of the Schottky diode in a multilayered structure, the impurity profile varies due to differences in the manufacturing step history, and uniform rectifying properties cannot be obtained; but using the oxide semiconductor 73 as the semiconductor of the rectifying element 70 of the nonvolatile memory device 10 according to this embodiment provides thermally stable rectifying properties. Even in a multilayered structure, rectifying properties are thereby obtained having almost uniform characteristic variation resulting from differences in the manufacturing step history. Thereby, it is possible to increase the bit density.

Thus, the nonvolatile memory device 10 according to this embodiment reduces the number of steps, reduces differences in levels, enables easy integration, and enables easy manufacturing of a high performance nonvolatile memory device having uniform characteristics of rectifying elements of each layer even in multiple memory layers.

To form the Schottky diode in the rectifying element 70 of the nonvolatile memory device 10, it is necessary to use materials having work functions that differ enough to form a sufficient Schottky barrier at an interface that forms a reverse direction diode, i.e., the Schottky interface 72. In other words, it is necessary that the work function of the electrode material is higher than the work function of the oxide semiconductor. To form the Schottky junction, it is favorable that the difference between the work functions of the electrode material and the semiconductor is at least 0.5 eV. In the case of $CoSi_2/n^-$ Si, which is a typical Schottky diode using a Si semiconductor, the Schottky barrier is about 0.61 eV; and in the case of $Pd/TiO_2$, which is a metal/metal oxide semiconductor, the Schottky barrier is about 0.67 eV.

It is important that the reactivity is low between the electrode 71 and the oxide semiconductor 73 of the rectifying element 70 of the nonvolatile memory device 10 according to this embodiment. Restated, it is important that the metal in the electrode 71 of the rectifying element 70 does not readily reduce the oxide semiconductor 73. To this end, the free energy (Gibbs free energy) per unit metal atom of the oxide of the metal of the electrode 71 is set higher than the free energy per unit metal atom of the oxide of the metal of the oxide semiconductor 73.

Thus, in the case where an oxide is used as the electrode of the rectifying element 70, it is possible to form and maintain a good Schottky interface that is stable against heating steps by using a metal element alone or as a nitride, silicide, carbide, and the like having a free energy (free energy per unit metal atom) higher than that of the oxide of the metal element of the oxide semiconductor 73.

In other words, the free energy per unit metal atom of the oxide of the metal of the oxide semiconductor 73 is set lower than the free energy per unit metal atom of the oxide of the metal of the electrode 71. Namely, $G_{ele1}$ and $G_{sem}$ satisfy Formula 1 below, where $G_{ele1}$ is the free energy per unit metal atom of the oxide of the metal of the electrode 71, and $G_{sem}$ is the free energy per unit metal atom of the oxide semiconductor 73 that includes a metal.

$$G_{sem} < G_{ele1} \qquad \text{Formula 1}$$

Various metals are listed below from high to low free energy per unit metal atom for metals formed as oxides.

Au>Ag>Pt>Pd>Ir>Ru>Cu>Ni>Co>Cd>Os>Bi>Rb> Cs>Zn>Sb>Fe>Re>In>Ga>Ba>Ge>Sn>Mg>W>Sr> Cr>Ca>Mo>Mn>Ta>Nb>V>Si>Ti>La>Sc>Y>Ho> Er>Ce>Zr>Hf>Al.

From the left to the right in the list recited above, that is, in the direction of the inequality sign, the free energy per unit metal atom of an oxide of the metal decreases.

Thus, in the case where, for example, TaN or TiN is used as the electrode 71 to form the Schottky junction, the oxide semiconductor 73 may be formed by an oxide of a metal to the right of Ta or Ti in the list of metals recited above such as, for example, $HfO_2$, $ZrO_2$, $Al_2O_3$, and the like.

In the case where W or WN is used as the electrode 71 to form the Schottky junction, the oxide semiconductor 73 may be formed by an oxide of a metal to the right of W in the list of metals recited above such as, for example, $MnO_2$, $Ta_2O_5$, $Nb_2O_5$, $V_2O_3$, $ZrO_2$, $HfO_2$, $Al_2O_3$, and the like.

In other words, to form the Schottky barrier of the rectifying element 70 of the nonvolatile memory device 10 according to this embodiment using the electrode 71 that includes a metal and the oxide semiconductor 73 that includes a metal, the metal of the oxide semiconductor 73 is selected from materials to the right of the metal of the electrode 71 in the inequality formula recited below.

Au>Ag>Pt>Pd>Ir>Ru>Cu>Ni>Co>Cd>Os>Bi>Rb> Cs>Zn>Sb>Fe>Re>In>Ga>Ba>Ge>Sn>Mg>W>Sr>Cr> Ca>Mo>Mn>Ta>Nb>V>Si>Ti>La>Sc>Y>Ho>Er>Ce> Zr>Hf>Al.

Thereby, reactions between materials forming the rectifying element 70, that is, between the electrode 71 and the oxide semiconductor 73, can be inhibited; and the characteristics of the rectifying element are stabilized.

Thus, the number of steps is reduced, the difference in levels is reduced, easy integration is enabled, and easy manufacturing is possible for a high performance nonvolatile memory device having uniform characteristics of rectifying elements of each layer even in multiple memory layers.

As illustrated in FIG. 4A, a forward-direction electrode 77 may be provided on the oxide semiconductor 73 on the side opposite to the electrode 71. To accommodate a sufficient forward-direction current at the interface between the oxide semiconductor 73 and the forward-direction electrode 77, it is possible to appropriately select the materials or the film composition, crystallinity, etc., thereof to provide a sufficiently small difference in the work functions of the oxide semiconductor 73 and the forward-direction electrode 77. It is also possible to form an interface that can accommodate a sufficient forward-direction current by causing the oxide semiconductor 73 and the forward-direction electrode 77 to react. Restated, for a forward-direction interface 76 between the oxide semiconductor 73 and the forward-direction electrode 77, the free energy per unit metal atom of the oxide of the metal of the forward-direction electrode 77 may be lower than the free energy per unit metal atom of the oxide of the metal of the oxide semiconductor 73. Namely, $G_{sem}$ and $G_{ele2}$ satisfy Formula 2 below, where $G_{ele2}$ is the free energy per unit metal atom of the oxide of the metal of the forward-direction electrode 77.

$$G_{sem} \geq G_{ele2} \qquad \text{Formula 2}$$

In other words, the forward-direction electrode 77 may include a metal that oxidizes more readily than the oxide semiconductor 73. Alternatively, the forward-direction electrode 77 may include a metal that oxidizes as readily as the oxide semiconductor 73.

Thus, the oxide semiconductor 73 in the forward-direction interface 76 of the diode is reduced and does not form a good Schottky barrier; and appropriate forward-direction characteristics can be obtained.

A material that provides a sufficiently small difference in work functions at the forward-direction interface 76 may be used as the forward-direction electrode 77.

As illustrated in FIG. 4B, the oxide semiconductor 73 of the rectifying element 70 of the nonvolatile memory device 10 according to this embodiment may have a two-layer structure. Namely, the oxide semiconductor 73 may include a stacked structure of a first oxide semiconductor layer 73a and a second oxide semiconductor layer 73b. The first oxide semiconductor layer 73a may be provided between the second oxide semiconductor layer 73b and the electrode 71. A Schottky junction is formed by the first oxide semiconductor layer 73a and the electrode 71. The second oxide semiconductor layer 73b functions to reduce the ON resistance of the rectifying element 70. The first oxide semiconductor layer 73a includes a chemically stable material having few defects to realize a stable Schottky junction with the electrode 71. Although the ON resistance tends to increase when such a material is used as the first oxide semiconductor layer 73a, it is possible to use a second oxide semiconductor layer 73b that is less chemically stable than the first oxide semiconductor layer 73a while acting to reduce the ON resistance.

In such a case, the relationship between the first oxide semiconductor layer 73a and the oxide of the metal of the electrode 71 is set similarly to Formula 1. Namely, $G_{ele1}$ and $G_{sem1}$ satisfy Formula 3 below, where $G_{sem1}$ is the free energy per unit metal atom of the oxide of the metal of the first oxide semiconductor layer 73a.

$$G_{sem1} < G_{ele1} \qquad \text{Formula 3}$$

The electrode 71 and the first oxide semiconductor layer 73a thereby do not react. In particular, the metal of the electrode 71 does not reduce the first oxide semiconductor layer 73a that includes a metal; and a Schottky junction having good rectifying properties is obtained. Effects of heating steps can thereby be suppressed as much as possible.

Further, the free energy per unit metal atom of the first oxide semiconductor layer 73a may be set lower than that of the second oxide semiconductor layer 73b to make the first oxide semiconductor layer 73a more chemically stable than the second oxide semiconductor layer 73b. Namely, it is desirable that $G_{sem1}$ and $G_{sem2}$ satisfy Formula 4 below, where $G_{sem2}$ is the free energy per unit metal atom of the oxide of the metal of the second oxide semiconductor layer 73b.

$$G_{sem1} < G_{sem2} \qquad \text{Formula 4}$$

A second oxide semiconductor layer 73b having such characteristics can inhibit reduction of the first oxide semiconductor layer 73a. Effects of heating steps also can be suppressed as much as possible.

It is desirable at the forward-direction interface 76 of the diode, i.e., the interface between the second oxide semiconductor layer 73b and the forward-direction electrode 77, that the free energy per unit metal atom of the oxide of the metal of the forward-direction electrode 77 is lower than that of the oxide of the metal of the second oxide semiconductor layer 73b. Namely, it is desirable that $G_{sem2}$ and $G_{ele2}$ satisfy Formula 5 below.

$$G_{ele2} \leq G_{sem2} \qquad \text{Formula 5}$$

In other words, it is desirable that the forward-direction electrode 77 includes a metal that oxidizes more readily than the metal of the second oxide semiconductor layer 73b. It is also desirable that the forward-direction electrode 77 includes a metal that oxidizes as readily as the metal of the second oxide semiconductor layer 73b.

Thus, the second oxide semiconductor layer 73b reduces and a good Schottky barrier is not formed in the forward-direction interface 76 of the diode; and appropriate forward-direction characteristics can be obtained. Effects of heating steps also can be suppressed as much as possible.

A material that provides a sufficiently small difference in work functions between the forward-direction electrode 77 and the second oxide semiconductor layer 73b at the forward-direction interface 76 of the diode can also be used as the forward-direction electrode 77. Thus, a good Schottky barrier is not formed in the forward-direction interface 76 of the diode, and appropriate forward-direction characteristics can be obtained.

In the case where, for example, TaN or TiN is used as the electrode 71 that forms the Schottky junction, $HfO_2$, $ZrO_2$, $Al_2O_3$, and the like, for example, may be used as the first oxide semiconductor layer 73a on the Schottky junction side. Formula 3 is thereby satisfied. By using such a material, the free energy per unit metal atom of the first oxide semiconductor layer 73a can be lower than that of the metal oxide of the metal of the electrode 71.

In such a case, $Ta_2O_5$, $Nb_2O_5$, $V_2O_3$, $MnO_2$, $TiO_2$, and the like, for example, may be used as the second oxide semiconductor layer 73b on the forward-direction side. Formula 4 is thereby satisfied, and such a case is therefore more favorable.

$TiO_2$ and the like, for example, may be used as the forward-direction electrode 77 in the case where, for example, $Ta_2O_5$ is used as the second oxide semiconductor layer 73b. Formula 5 is thereby satisfied, and such a case is therefore more favorable.

As described above, the use of materials that satisfy Formula 3 to Formula 5 in each of the electrode 71, the first oxide semiconductor layer 73a, the second oxide semiconductor layer 73b, and the forward-direction electrode 77 of the rectifying element 70 prevent the materials that form the rectifying element 70 from reacting inappropriately; and a rectifying element 70 is obtained having a reduced ON resistance and good characteristics.

Although Formula 5 is not satisfied in the description above in the case where $TiO_2$ is used as the second oxide semiconductor layer 73b and WN is used as the forward-direction electrode 77, a small difference in work functions at the forward-direction interface 76 is provided; and such a combination of materials may be used.

In other words, it is not necessary that Formula 3 to Formula 5 recited above are simultaneously satisfied; and, for example, only Formula 3 may be satisfied. In the case where Formula 4 is satisfied in addition to Formula 3, the ON resistance is reduced as described above, and better rectifying properties are obtained. In the case where, for example, Formula 5 is satisfied in addition to Formula 3, the second oxide semiconductor layer 73b reduces and a good Schottky barrier is not formed as described above; appropriate forward-direction characteristics are obtained; and better characteristics are obtained.

$MnO_2$, $Ta_2O_5$, $Nb_2O_5$, $V_2O_3$, $TiO_2$, $ZrO_2$, $HfO_2$, $Al_2O_3$, $SiO_2$, and the like may be used as the first oxide semiconductor layer 73a on the Schottky junction side in the case where, for example, W or WN, which has a relatively small work function, is used as the electrode 71 that forms the Schottky junction. Formula 3 is thereby satisfied.

$MgO_2$, $In_2O_3$, $SnO_2$, $ZnO_2$, $TiO_2$, and the like may be used as the second oxide semiconductor layer 73b on the forward-direction side in such a case. Formula 4 is thereby satisfied.

Although Formula 5 is not satisfied in the case where $TiO_2$ is used as the second oxide semiconductor layer 73b and WN is used as the forward-direction electrode 77 as described above, the difference in work functions at the forward-direction interface 76 can be reduced, and such a combination of materials may be used.

Thus, after selecting a material to be used as one of the electrode 71, the first oxide semiconductor layer 73a, the second oxide semiconductor layer 73b, and the forward-direction electrode 77, materials to be used as the others can be appropriately selected as described above.

The forward-direction electrode 77 recited above also may be a portion of a conductive layer forming a recording unit that includes the memory layer 60 as described below. Moreover, the forward-direction electrode 77 may be omitted; and, for example, the second oxide semiconductor layer 73b may directly contact the recording unit; and, for example, the second oxide semiconductor layer 73b may directly contact the memory layer 60.

For example, in another rectifying element 70 of the nonvolatile memory device 10 according to this embodiment as illustrated in FIG. 5, the electrode 71, the first oxide semiconductor layer 73a, and the second oxide semiconductor layer 73b are stacked. A Schottky junction is formed at the interface (Schottky interface 72) between the electrode 71 and the first oxide semiconductor layer 73a. Restated, the electrode 71 and the first oxide semiconductor layer 73a form a Schottky junction. The forward-direction electrode 77 is provided on the second oxide semiconductor layer 73b side.

In this example, TiN, for example, is used as the electrode 71; $ZrO_2$, for example, is used as the first oxide semiconductor layer 73a; $Ta_2O_5$, for example, is used as the second oxide semiconductor layer 73b; and TiN, for example, is used as the forward-direction electrode 77. Formula 3 to Formula 5 recited above are thereby satisfied.

On the other hand, a recording unit 63 is provided on the rectifying element 70 on the second oxide semiconductor layer 73b side. The recording unit 63 includes a first conductive layer 61, a second conductive layer 62, and a memory layer 60 provided between the first conductive layer 61 and the second conductive layer 62. In other words, the nonvolatile memory device further includes the first conductive layer 61 provided on the memory layer 60 on the rectifying element 70 side and the second conductive layer 62 provided on the memory layer 60 on a side opposite to the first conductive layer 61.

In this case, the forward-direction electrode 77 of the rectifying element 70 is shared as the first conductive layer 61 of the recording unit 63.

In this example, TiN, for example, is used as the first conductive layer 61 (the forward-direction electrode 77 of the rectifying element 70); Ti-doped $NiO_x$ is used as the memory layer 60; and TiN is used as the second conductive layer 62.

Thus, the nonvolatile memory device 10 according to this embodiment uses a Schottky diode as the rectifying element 70. The Schottky diode requires only a metal/semiconductor interface. Therefore, it is easy to reduce the differences in levels and the number of manufacturing steps.

The semiconductor layer of the Schottky diode is formed by a semiconductor that includes a metal, and specifically, a metal oxide semiconductor (the oxide semiconductor 73, the first oxide semiconductor layer 73a, and the second oxide semiconductor layer 73b). Thereby, a reaction cannot readily occur with the metal oxide (Ti-doped $NiO_x$ in this case) of the memory layer 60 of the recording unit 63. Integration can thereby be performed easily.

Formula 1 to Formula 3 are satisfied by appropriately selecting materials used as the electrode 71, the oxide semiconductor (the oxide semiconductor 73, the first oxide semiconductor layer 73a, and the second oxide semiconductor layer 73b), and the forward-direction electrode 77 to form the Schottky diode. It is thereby possible to inhibit the materials from reacting and changing. Effects of heating steps can be inhibited as much as possible, providing uniform characteristics of the stacked diodes and realizing excellent cell characteristics.

FIG. 1 illustrates voltage-current characteristics of the rectifying element 70 illustrated in FIG. 5. Restated, FIG. 1 illustrates voltage-current characteristics between the electrode 71 and the forward-direction electrode 77 of the rectifying element 70 illustrated in FIG. 5. In FIG. 1, the solid line is the characteristic of the rectifying element 70 directly after formation at room temperature; and the broken line is the characteristic after performing annealing at 700° C. after formation of the rectifying element 70 at room temperature. The configuration of the rectifying element 70 in FIG. 1 is illustrated vertically inverted from FIG. 5.

In the rectifying element 70 of the nonvolatile memory device 10 according to this embodiment as illustrated in FIG. 1, there is essentially no change in the voltage-current characteristics with or without annealing. Thus, the rectifying element 70 can be formed at room temperature and is easy to manufacture. Further, the characteristics do not change even when annealed. Therefore, it is possible to provide stable performance, obtain uniform characteristics of stacked rectifying elements, and realize excellent storage operations.

Comparative Example

Figure 6A:
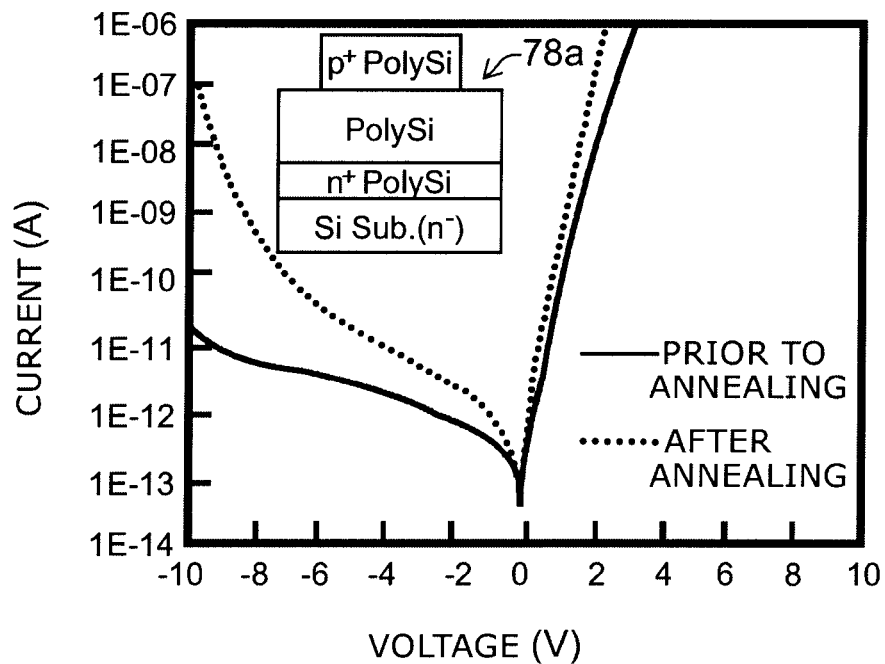
FIGS. 6A and 6B are schematic views and graphs illustrating configurations and characteristics of rectifying elements of first and second comparative examples, respectively.
Figure 6B:
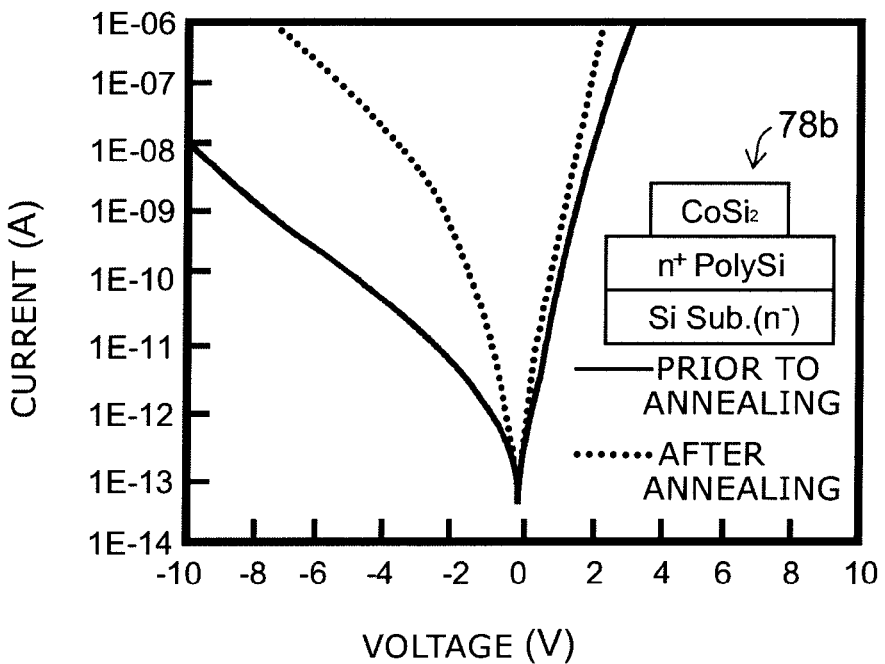

FIGS. 6A and 6B are schematic views and graphs illustrating configurations and characteristics of rectifying elements of first and second comparative examples, respectively.

In these graphs, the solid line is the characteristic directly after formation of the rectifying element 70 at room temperature, and the broken line is the characteristic after annealing at 700° C. after formation of the rectifying element 70 at room temperature.

As illustrated in FIG. 6A, a rectifying element 78a of a nonvolatile memory device of the first comparative example is a diode having a PIN structure. Namely, the rectifying element 78a has a configuration in which an n$^+$ polysilicon layer (n$^+$ Poly Si), non-doped polysilicon (Poly Si), and a p$^+$ polysilicon layer (p$^+$ Poly Si) are stacked above a silicon substrate (Si Sub. (n$^-$)). In the rectifying element 78a of the nonvolatile memory device of the first comparative example, the thickness of the non-doped layer (Poly Si) must, in particular, be increased to ensure insulative properties. The overall thickness therefore increases; differences in levels during processing steps increase; and manufacturing becomes difficult.

As illustrated in FIG. 6A, the voltage-current characteristics after annealing change greatly in comparison to those prior to annealing. This change is because the impurity profile of the PIN layer in the PIN structure using a semiconductor such as silicon changes readily during steps after the formation of the PIN layer. Therefore, in the case where such a PIN diode configuration is used as the rectifying element, it is difficult to provide uniform characteristics of rectifying elements in each layer of a stacked nonvolatile memory device; writing and reading characteristics vary among memory layers; and uniform write/erase operations cannot be achieved.

As illustrated in FIG. 6B, a rectifying element 78b of a nonvolatile memory device of the second comparative example is a Schottky diode formed by cobalt silicide (CoSi$_2$) and n-type polycrystalline silicon. Namely, an n$^+$ polysilicon layer (n$^+$ Poly Si) and a cobalt silicide layer (CoSi$_2$) are stacked above a silicon substrate (Si Sub. (n$^-$)).

As illustrated in FIG. 6B, the voltage-current characteristics after annealing change greatly in comparison to those prior to annealing. This change is because a semiconductor that includes silicon rather than an oxide that includes a metal is used as the semiconductor layer of the Schottky diode. In this case, the CoSi$_2$ electrode reacts with the n$^+$ polysilicon layer during heat treatment and Schottky junction is degraded.

Therefore, in the case where a Schottky diode of such a configuration, that is, a Schottky diode using a silicon semiconductor, is used as the rectifying element, it is difficult to provide uniform characteristics of rectifying elements in each layer of a stacked nonvolatile memory device; writing, reading and erasing characteristics vary among the memory layers; and normal storage operations cannot be achieved.

Thus, each of the rectifying elements 78a and 78b of the nonvolatile memory devices of the first and second comparative examples encounter technical difficulties when applied in stacked nonvolatile memory devices, such as the height of the stacked elements being too high, strict limitations being imposed on the heating steps used in the manufacturing steps, etc.

Conversely, as described above, in the rectifying element 70 of the nonvolatile memory device 10 according to this embodiment, characteristics essentially do not change even when annealed. Therefore, it is possible to provide stable performance, obtain uniform characteristics of stacked rectifying elements, and realize excellent storage operations.

In the nonvolatile memory device 10 according to this embodiment, Formula 1 and Formula 3 can be applied even in the case where multiple metals are included in each of the electrode 71, the oxide semiconductor 73, and the first oxide semiconductor layer 73a of the rectifying element 70; but at the interface formed by the Schottky junction of the Schottky diode, excluding elements included as impurities, Formula 1 or Formula 3 must hold between all of the metal elements of the electrode and all of the metal elements of the oxide semiconductor. At the forward-direction interface, excluding elements included as impurities, Formula 2 or Formula 5 must hold between at least one metal element of the electrode and at least one metal element of the oxide semiconductor.

For example, in the case where the electrode 71 includes a metal A and a metal B, and the oxide semiconductor 73 is an oxide semiconductor including the metal B and a metal C, Formula 1 holds between the metal A and the metal C.

For example, in the case where the electrode 71 includes the metal A and the metal B, and the oxide semiconductor 73 is an oxide semiconductor including the metal C and a metal D, Formula 1 holds between the metal A and the metal C, and between the metal A and the metal D. Formula 1 also holds between the metal B and the metal C, and between the metal B and the metal D.

In the case where the electrode 71 includes the metal A and the metal B, and the first oxide semiconductor layer 73a is an oxide semiconductor including the metal B and the metal C, Formula 3 holds between the metal A and the metal B, and between the metal A and the metal C.

For example, in the case where the electrode 71 includes the metal A and the metal B, and the first oxide semiconductor layer 73a is an oxide semiconductor including the metal C and the metal D, Formula 1 holds between the metal A and the metal C, and between the metal A and the metal D. Also, Formula 3 holds between the metal B and the metal C, and between the metal B and the metal D.

In the nonvolatile memory device 10 according to this embodiment, Formula 2 and Formula 5 can be applied even in the case where multiple metals are included in each of the forward-direction electrode 77, the oxide semiconductor 73, and the second oxide semiconductor layer 73b of the rectifying element 70.

For example, in the case where the forward-direction electrode 77 includes the metal A and the metal B, and the oxide semiconductor 73 is an oxide semiconductor including the metal B and the metal C, Formula 2 holds between the metal A and the metal B, between the metal A and the metal C, or between the metal B and the metal C.

For example, in the case where the forward-direction electrode 77 includes the metal A and the metal B, and the oxide semiconductor 73 is an oxide semiconductor including the metal C and the metal D, Formula 2 holds between the metal A and the metal C, between the metal A and the metal D, between the metal B and the metal C, or between the metal B and the metal D.

In the case where the forward-direction electrode 77 includes the metal A and the metal B, and the second oxide semiconductor layer 73b is an oxide semiconductor including the metal B and the metal C, Formula 5 holds between the metal A and the metal B, between the metal A and the metal C, or between the metal B and the metal C.

For example, in the case where the forward-direction electrode 77 includes the metal A and the metal B, and the second oxide semiconductor layer 73b is an oxide semiconductor including the metal C and the metal D, Formula 5 holds between the metal A and the metal C, between the metal A and the metal D, between the metal B and the metal C, or between the metal B and the metal D.

Thus, in the nonvolatile memory device 10 according to this embodiment, the number of process steps is reduced, the difference in levels is reduced, easy integration is enabled, and easy manufacturing is possible for a high performance nonvolatile memory device having uniform characteristics of rectifying elements of each layer even in multiple memory layers.

First Example

A first example according to this embodiment will now be described.

Figures 7A, 7B:
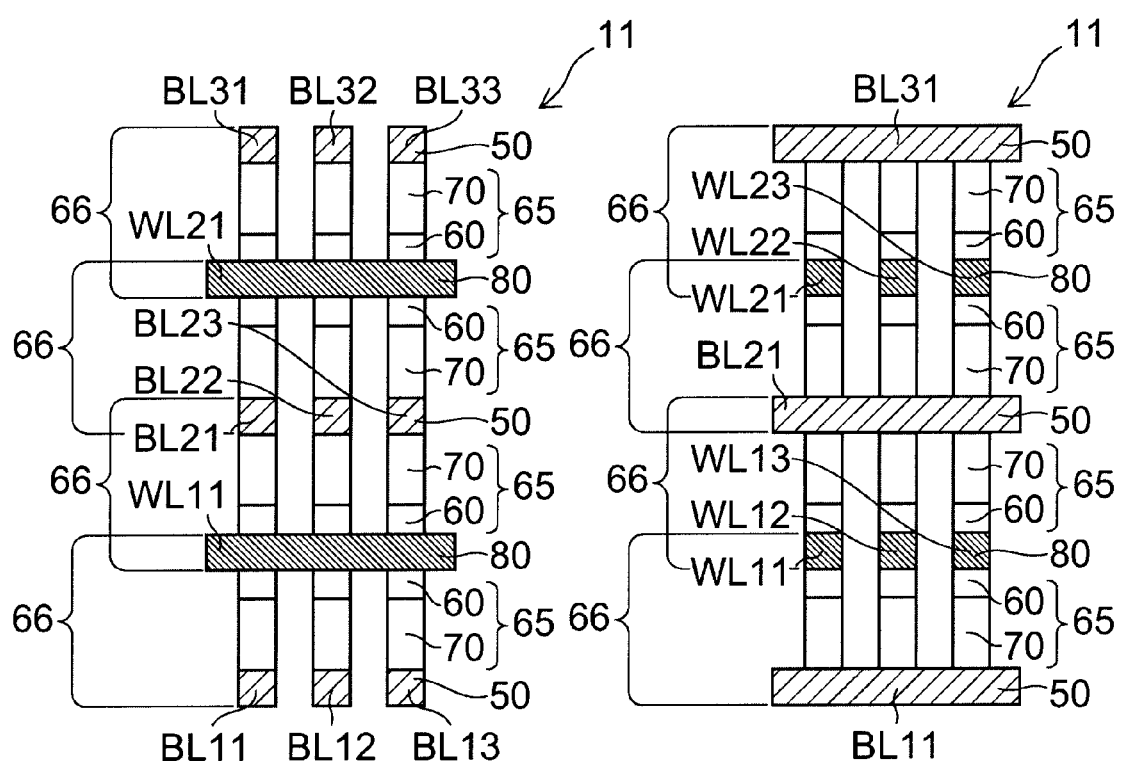
FIGS. 7A and 7B are schematic cross-sectional views illustrating a configuration of a nonvolatile memory device according to the first example of the present invention.

FIGS. 7A and 7B are schematic cross-sectional views illustrating a configuration of a nonvolatile memory device according to the first example of the present invention.

In a nonvolatile memory device 11 according to the first example of the present invention as illustrated in FIGS. 7A and 7B, the word lines and the bit lines of the nonvolatile memory device 10 illustrated in FIGS. 2A to 2C are interchanged. Namely, bit lines BL11, BL12, and BL13 are provided on the lowermost layer; word lines WL11, WL12, and WL13 are provided thereabove; bit lines BL21, BL22, and BL23 are provided thereabove; word lines WL21, WL22, and WL23 are provided thereabove; and bit lines BL31, BL32, and BL33 are provided thereabove. The stacked structure unit 65 that includes the memory layer 60 and the rectifying element 70 is provided therebetween. Restated, the nonvolatile memory device 11 is an example of a four-layer nonvolatile memory device having four stacked component memory layers 66. The first wiring 50 is a bit line and the second wiring 80 is a word line in this example.

The nonvolatile memory device 11 of this example includes the rectifying element 70 and the recording unit 63 of the configuration illustrated in FIG. 5. Namely, the configuration is a stacked configuration including the rectifying element 70 formed by a Schottky diode having a titanium nitride (TiN)/zirconia (ZrO$_2$)/tantalum oxide (Ta$_2$O$_5$)/(TiN) structure, and a variable resistance element (the recording unit 63) having a MIM (Metal-Insulator-Metal) structure. The recording unit 63 has a stacked configuration including the first conductive layer 61 formed by TiN (shared as the forward-direction electrode 77 of the rectifying element 70), the memory layer 60 formed by Ti-doped NiO$_x$, and the second conductive layer 62 formed by TiN. This embodiment is in regard to the configuration of the cell portion of the nonvolatile memory device, and therefore a description of the formation of the peripheral circuit and the like is omitted to avoid complexity.

As described above, the nonvolatile memory device 11 including the rectifying element 70 and the recording unit 63 having such a configuration reduces the number of steps, reduces differences in levels, enables easy integration, and enables easy manufacturing of a high performance nonvolatile memory device having uniform characteristics of rectifying elements of each layer even in multiple memory layers.

A method for manufacturing the nonvolatile memory device 11 according to this example will now be described.

Figure 8A:
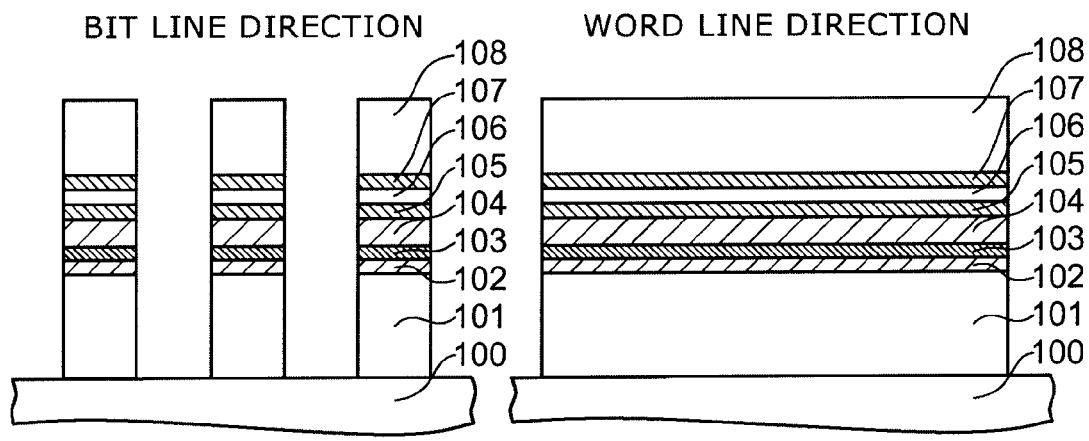
FIGS. 8A and 8B are schematic cross-sectional views in order of the steps, illustrating the method for manufacturing the nonvolatile memory device according to the first example of the present invention.
Figure 8B:
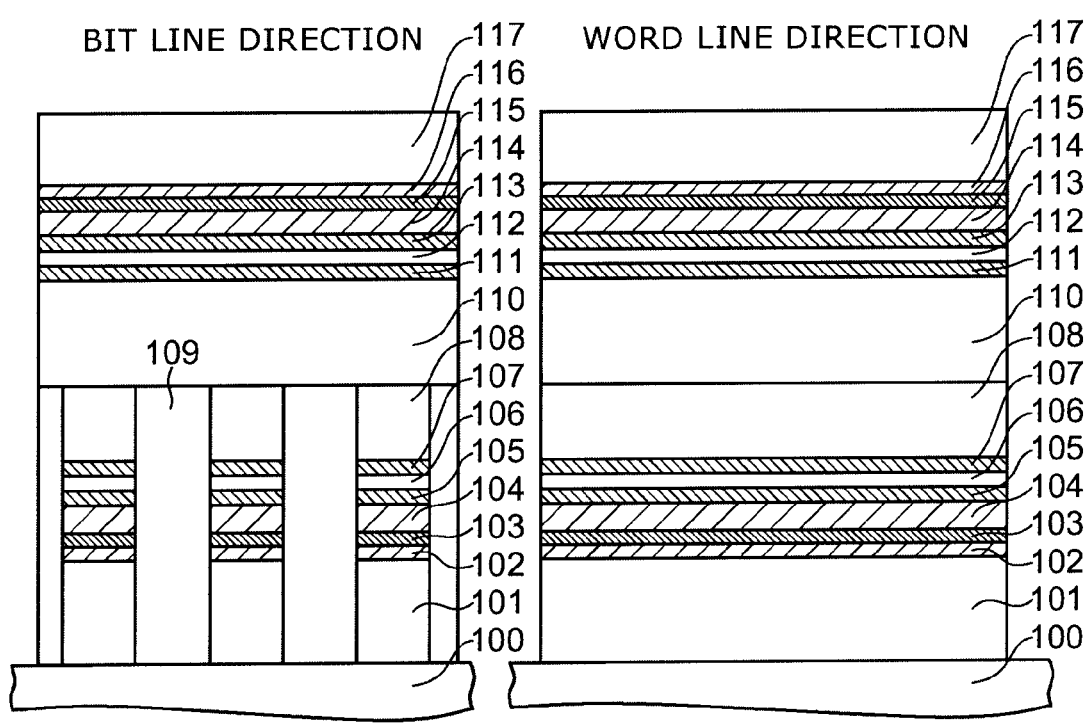

FIGS. 8A and 8B are schematic cross-sectional views in order of the steps, illustrating the method for manufacturing the nonvolatile memory device according to the first example of the present invention.

Namely, FIG. 8A illustrates the first steps, and FIG. 8B continues from FIG. 8A.

Figure 9:
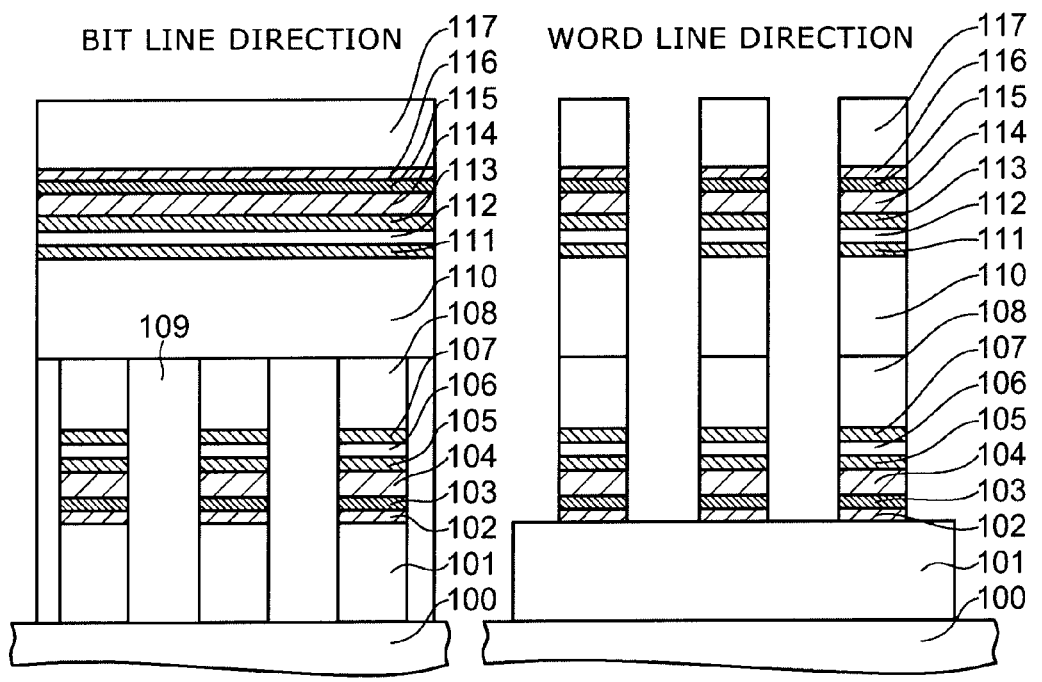
FIG. 9 is a schematic cross-sectional view in order of the steps continuing from FIG. 8B.

FIG. 9 is a schematic cross-sectional view in order of the steps continuing from FIG. 8B.

In each of these drawings, the drawing on the left side is a cross-sectional view in the bit line direction, that is, a cross-sectional view cut along a plane perpendicular to the aligning direction of the bit lines; and the drawing on the right side is a cross-sectional view in the word line direction, that is, a cross-sectional view cut along a plane perpendicular to the aligning direction of the word lines.

First, as illustrated in FIG. 8A, a tungsten film 101 that forms bit lines (for example, BL11, BL12, BL13, and so on) is formed with a thickness of 70 nm above a semiconductor substrate (substrate) 100.

These bit lines need not be the bit lines BL11, BL12, and BL13, and may be bit lines of another component memory layer of stacked component memory layers such as, for example, bit lines BL21, BL22, and BL23, or BL31, BL32, and BL33, or any series of bit lines in a nonvolatile memory device having a structure of more layers.

A titanium nitride (TiN) film 102 that forms the electrode 71 of the rectifying element 70 is then formed with a thickness of 10 nm. A zirconia (ZrO$_2$) film 103 that forms the first oxide semiconductor layer 73a of the rectifying element 70 and a tantalum oxide (Ta$_2$O$_5$) film 104 that forms the second oxide semiconductor layer 73b are then formed with thicknesses of 10 nm and 20 nm, respectively.

Continuing, a titanium nitride film 105 that forms an electrode (first conductive layer 61) of the recording unit 63 is formed with a thickness of 10 nm; a Ti-doped NiO$_x$ film 106 that forms the memory layer 60 is formed with a thickness of 10 nm; a titanium nitride film 107 that forms an electrode (the second conductive layer 62) of the recording unit 63 is formed with a thickness of 10 nm; a tungsten film 108 that forms a CMP (Chemical Mechanical Polishing) stopper is formed with a thickness of 50 nm; and the stacked films are collectively processed (sequentially patterned) into a band configuration by lithography and reactive ion etching.

As illustrated in FIG. 8B, an inter-layer dielectric film 109 is then filled between the stacked films patterned into the band configuration, and planarized by CMP. A tungsten film 110 that forms word lines is then formed with a thickness of 70 nm on the entire surface of the configuration (the substrate including the stacked films formed as described above). Thereupon, a titanium nitride film 111 that forms an electrode (the second conductive layer 62) of the recording unit 63 is formed with a thickness of 10 nm; a Ti-doped NiO$_x$ film 112 that forms the memory layer 60 is formed with a thickness of 10 nm; a titanium nitride film 113 that forms an electrode (the first conductive layer 61) of the recording unit 63 is formed with a thickness of 10 nm; a tantalum oxide film 114 that forms the second oxide semiconductor layer 73b of the rectifying element 70 is formed with a thickness of 20 nm; a zirconia film 115 that forms the first oxide semiconductor layer 73a is formed with a thickness of 10 nm; a titanium nitride film 116 that forms the electrode 71 of the rectifying element 70 is formed with a thickness of 10 nm; and a tungsten film 117 that forms a CMP stopper is formed with a thickness of 50 nm.

Continuing as illustrated in FIG. 9, the stacked films are collectively patterned into a band configuration by lithography and reactive ion etching to form two component memory layers.

Then, formation proceeds similarly to form four component memory layers, and the nonvolatile memory device 11 according to this example is constructed. In the case of more than four layers as well, methods similar to those described above are repeated to form a nonvolatile memory device having multiple component memory layers.

The diode characteristics (voltage-current characteristics) of the rectifying element 70 of the nonvolatile memory device 11 according to this example are as described above in FIG. 1.

Thus, the nonvolatile memory device 11 and the method for manufacturing the same according to this example reduces the number of steps, reduces differences in levels, enables easy integration, and enables easy manufacturing of a high performance nonvolatile memory device having uniform characteristics of rectifying elements of each layer even in multiple memory layers.

Although a Ti-doped $NiO_x$ film is used as the memory layer 60 in this example, any substance wherein a voltage applied to both ends causes the resistance state to change may be used. Namely, the memory layer 60 may include, for example, C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$; and may include any substance wherein Joule heat generated by a current that flows between both ends causes the resistance state to change, such as at least one selected from the group consisting of chalcogenide GST ($Ge_xSb_yTe_z$), N-doped GST and O-doped GST in which a dopant is added to a GST, $Ge_xSb_y$, and $In_xGe_yTe_z$. Additionally, a material may be included having two or more of such materials mixed. Furthermore, a structure of multiply stacked layers of such materials can be used.

Although titanium nitride was used as the material of the electrodes (the first conductive layer 61 and the second conductive layer 62) of the recording unit 63 in this example, various materials that do not react with the memory layer 60 recited above and do not degrade the variable resistance properties may be used. Namely, the electrode material of the recording unit 63 may include at least one selected from the group consisting of tungsten nitride, titanium nitride, titanium aluminum nitride, tantalum nitride, titanium silicide nitride, tantalum carbide, titanium silicide, tungsten silicide, cobalt silicide, nickel silicide, nickel platinum silicide, platinum, ruthenium, platinum-rhodium, and iridium. Additionally, a material may be included having two or more of such materials mixed. Furthermore, a structure of multiply stacked layers of such materials may be used.

Second Example

Figures 10A, 10B:
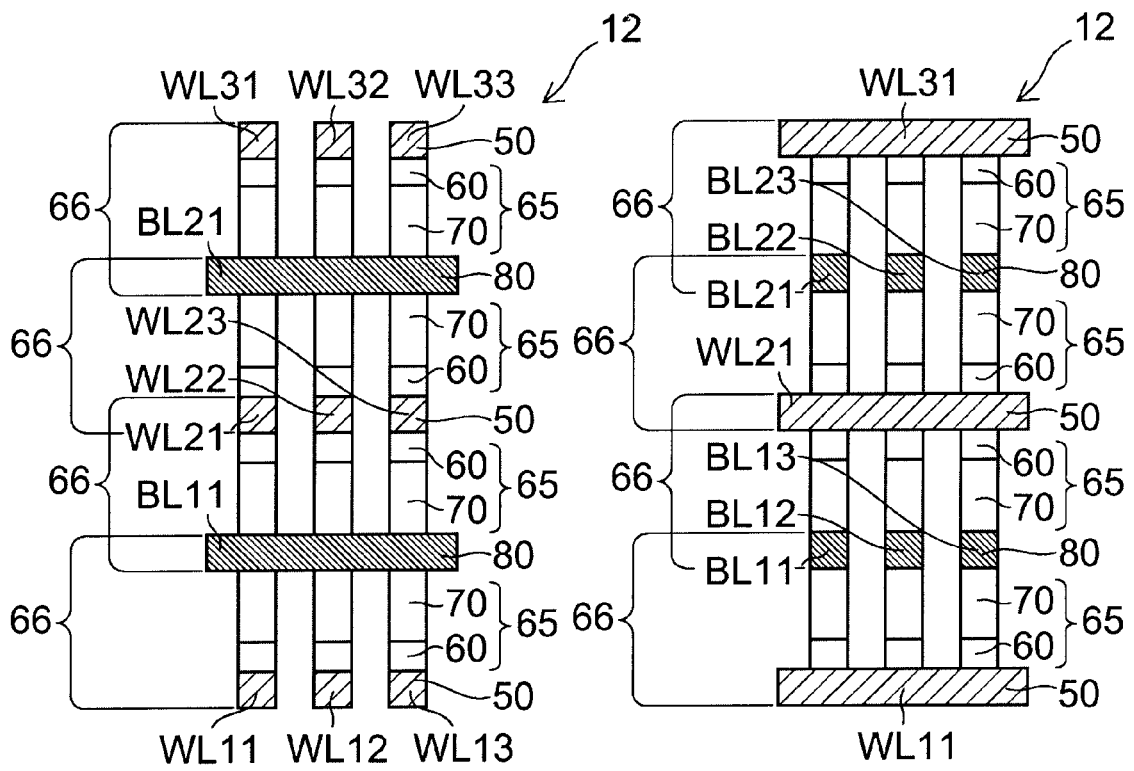
FIGS. 10A and 10B are schematic cross-sectional views illustrating a configuration of a nonvolatile memory device according to a second example of the present invention.

FIGS. 10A and 10B are schematic cross-sectional views illustrating a configuration of a nonvolatile memory device according to a second example of the present invention.

A nonvolatile memory device 12 of the second example according to this embodiment includes the stacked configuration illustrated in FIG. 2A. Namely, the nonvolatile memory device 12 is an example of a nonvolatile memory device having a four-layer structure that includes word lines WL11, WL12, and WL13 provided on the lowermost layer; bit lines BL11, BL12, and BL13 provided thereabove; word lines WL21, WL22, and WL23 provided thereabove; bit lines BL21, BL22, and BL23 provided thereabove; word lines WL31, WL32, and WL33 provided thereabove; and the stacked structure unit 65 that includes the memory layer 60 and the rectifying element 70 provided therebetween. In this example, the first wiring 50 is a word line, and the second wiring 80 is a bit line.

However, the nonvolatile memory device 12 is an example in which the stack order of the memory layer 60 and the rectifying element 70 is the reverse of that of the nonvolatile memory device 10 illustrated in FIGS. 2B and 2C.

Figure 11:
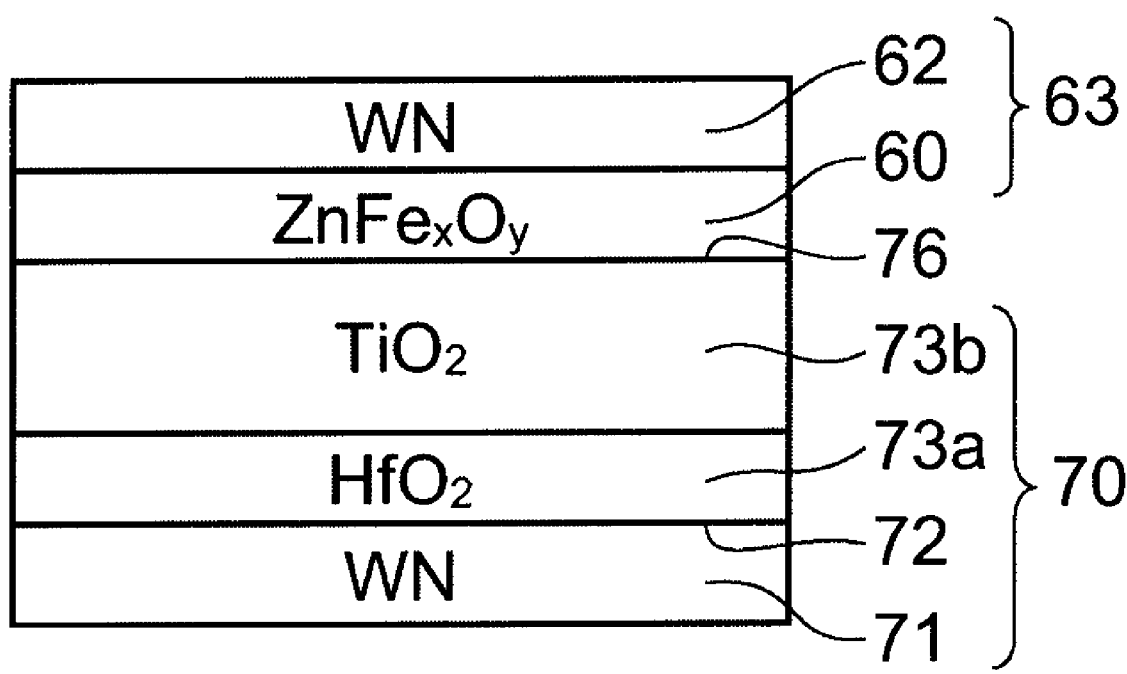
FIG. 11 is a schematic cross-sectional view illustrating a configuration of main components of the nonvolatile memory device according to the second example of the present invention.

FIG. 11 is a schematic cross-sectional view illustrating a configuration of main components of the nonvolatile memory device according to the second example of the present invention.

As illustrated in FIG. 11, the electrode 71, the first oxide semiconductor layer 73a, and the second oxide semiconductor layer 73b are stacked in the rectifying element 70 of the nonvolatile memory device 12 according to this example. A Schottky junction is formed at the interface (the Schottky interface 72) between the electrode 71 and the first oxide semiconductor layer 73a. Restated, the electrode 71 and the first oxide semiconductor layer 73a form a Schottky junction.

In this example, WN, for example, is used as the electrode 71; $HfO_2$, for example, is used as the first oxide semiconductor layer 73a; and $TiO_2$, for example, is used as the second oxide semiconductor layer 73b.

Formula 3 and Formula 4 recited above are thereby satisfied.

The rectifying element 70 directly contacts the memory layer 60 in the nonvolatile memory device 12. Namely, the second oxide semiconductor layer 73b that forms the oxide semiconductor of the rectifying element 70, and the memory layer 60 of the recording unit 63 are provided in direct contact. Restated, the forward-direction electrode 77 of the rectifying element 70 and the first conductive layer 61 of the recording unit 63 are omitted.

$ZnFe_xO_y$ is used as the memory layer 60, and WN is used as the second conductive layer 62 of the recording unit 63.

Thus, it is easy to reduce differences in levels and the number of manufacturing steps by using a Schottky diode as the rectifying element 70 in the nonvolatile memory device 12 according to this example.

Further, reactions with the $ZnFe_xO_y$ of the memory layer 60 do not readily occur and integration is easy by using a metal oxide semiconductor (the first oxide semiconductor layer 73a and the second oxide semiconductor layer 73b) as the semiconductor layer of the rectifying element 70.

Formula 3 and Formula 4 are satisfied by appropriately selecting the materials of the electrode 71, the first oxide semiconductor layer 73a, and the second oxide semiconductor layer 73b of the rectifying element 70. It is thereby possible to prevent the materials from reacting and changing. Effects of heating steps can thereby be inhibited as much as possible, providing uniform characteristics of the stacked diodes and realizing excellent cell characteristics.

Here, the forward-direction electrode 77 of the rectifying element 70 and the first conductive layer 61 of the recording unit 63 (which both function also as barrier metals) are omitted; and the second oxide semiconductor layer 73b of the rectifying element 70 and the memory layer 60 are provided in direct contact. Thereby, the configuration and manufacturing steps can be simplified, leading to lower costs. Omitting layers of the stacked structure unit 65 reduces differences in levels during processing and further enables easy manufacturing of the nonvolatile memory device.

Thus, the nonvolatile memory device 12 according to this example reduces the number of steps, reduces differences in levels, enables easy integration, and enables easy manufacturing of a high performance nonvolatile memory device having uniform characteristics of rectifying elements of each layer even in multiple memory layers.

A method for manufacturing the nonvolatile memory device 12 will now be described.

Figure 12A:
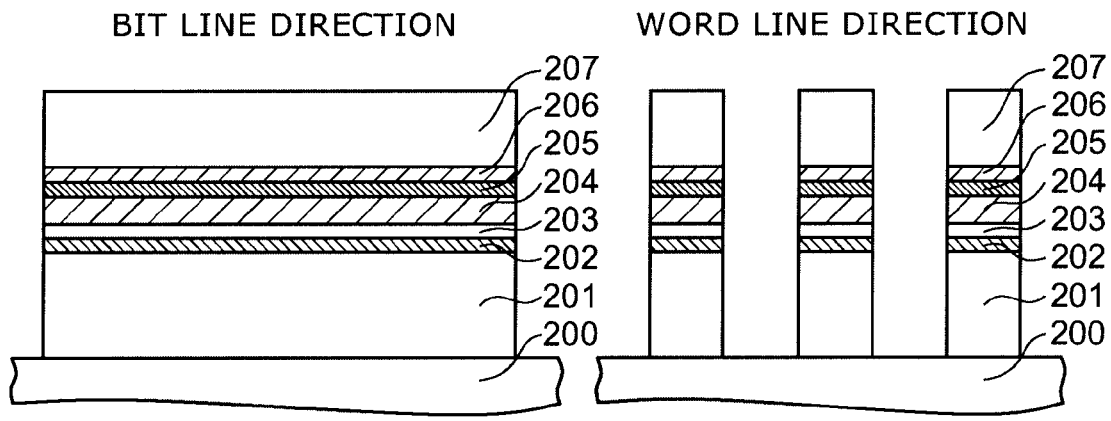
FIGS. 12A and 12B are schematic cross-sectional views in order of the steps, illustrating a method for manufacturing the nonvolatile memory device according to the second example of the present invention.
Figure 12B:
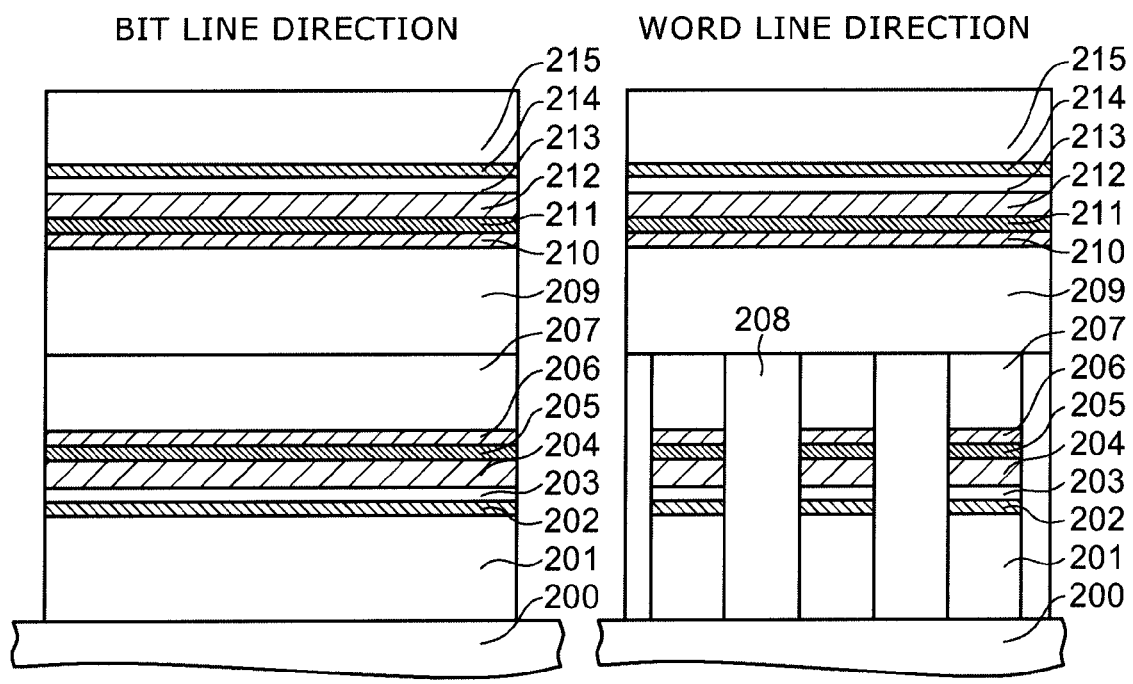

FIGS. 12A and 12B are schematic cross-sectional views in order of the steps, illustrating a method for manufacturing the nonvolatile memory device according to the second example of the present invention.

FIG. 12A illustrates the first steps, and FIG. 12B continues from FIG. 12A.

Figure 13:
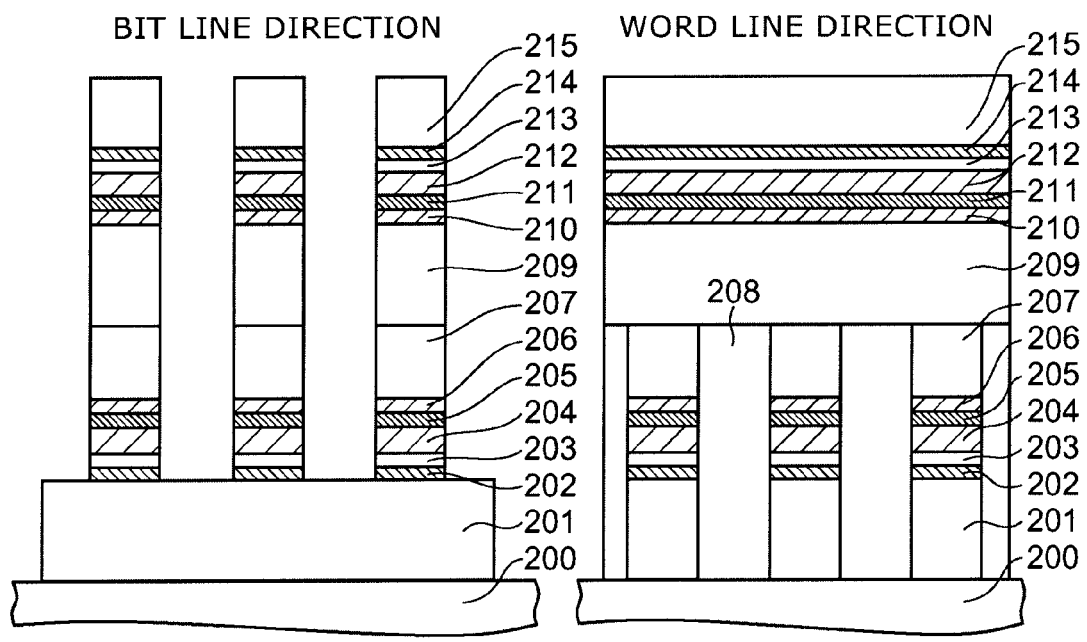
FIG. 13 is a schematic cross-sectional view in order of the steps continuing from FIG. 12B.

FIG. 13 is a schematic cross-sectional view in order of the steps continuing from FIG. 12B.

In each of these drawings, the drawing on the left side is a cross-sectional view in the bit line direction, that is, a cross-sectional view cut along a plane perpendicular to the aligning direction of the bit lines; and the drawing on the right side is a cross-sectional view in the word line direction, that is, a cross-sectional view cut along a plane perpendicular to the aligning direction of the word lines.

First, as illustrated in FIG. 12A, a tungsten film 201 that forms word lines of the nonvolatile memory device is formed with a thickness of 70 nm above a semiconductor substrate (substrate) 200.

Similar to the first example, the word lines need not be word lines of the lowermost layer of the stacked memory, and may be word lines of stacked upper layers.

Then, a tungsten nitride film 202 that forms electrodes (the second conductive layer 62 which also functions as barrier metal) of the recording unit 63 is formed with a thickness of 10 nm; a $ZnFe_xO_y$ film 203 that forms the memory layer 60 is formed with a thickness of 10 nm; titania ($TiO_2$) 204 that forms the second oxide semiconductor layer 73b of the rectifying element 70 is formed with a thickness of 20 nm; a hafnia ($HfO_2$) film 205 that forms the first oxide semiconductor layer 73a of the rectifying element 70 is formed with a thickness of 10 nm; a tungsten nitride (WN) film 206 that forms the electrode 71 of the rectifying element 70 is formed with a thickness of 10 nm; and a tungsten film 207 that forms a CMP stopper is formed with a thickness of 50 nm.

Although the $ZnFe_xO_y$ film 203 that forms the memory layers 60 and the titania film 204 that forms the second oxide semiconductor layer 73b are in direct contact in the stacked structure of this example, both are oxides; Schottky barriers are not formed therebetween; and a good electrical connection can be provided. Therefore, it is possible to simplify the stacked structure.

Although the hafnia film 205 that forms the first oxide semiconductor layer 73a functions to form a good Schottky junction with the electrode 71 formed by the tungsten nitride film 206, the first oxide semiconductor layer 73a (the hafnia film 205) may be omitted by forming the electrode 71 by a material such as Pt, Au, Ir, Ru, Re, and the like having a free energy per unit metal atom of the oxide thereof higher than that of W. In such a case, the film thickness of the titania film that forms the second oxide semiconductor layer 73b is made thicker than that of this example to alleviate the electric field applied to the Schottky junction. In such a case, the oxide semiconductor is a one-layer structure (the titania film 204), and Formula 1 is satisfied with the electrode 71 (the tungsten nitride film 206).

Further, it is possible to omit the tungsten nitride film 202 that forms the second conductive layer 62 of the recording unit 63 that functions as barrier metal and an electrode film by selecting an appropriate word line material. Thus, an interface between a metal and a semiconductor is sufficient to form a Schottky diode; and the diode structure can be greatly simplified by an appropriate material selection.

The stacked films are then collectively patterned (sequentially pattered) into a band configuration by lithography and reactive ion etching.

As illustrated in FIG. 12B, an inter-layer dielectric film 208 is filled between the stacked films processed into the band configuration, and planarized by CMP.

Continuing, a tungsten film 209 that forms bit lines is formed on the entire surface of the configuration (substrate). Thereupon, a tungsten nitride film 210 that forms the electrode 71 of the rectifying element 70 is formed with a thickness of 10 nm; a hafnia film 211 that forms the first oxide semiconductor layer 73a of the rectifying element 70 is formed with a thickness of 10 nm; a titania film 212 that forms the second oxide semiconductor layer 73b of the rectifying element 70 is formed with a thickness of 20 nm; a $ZnFe_xO_y$ film 213 that forms the memory layers 60 is formed with a thickness of 10 nm; a tungsten nitride film 214 that forms electrodes (the second conductive layer 62) of the recording unit 63 is formed with a thickness of 10 nm; and a tungsten film 215 that forms a CMP stopper is formed with a thickness of 50 nm.

As illustrated in FIG. 13, the two component memory layers are then formed by collectively patterning the stacked films into a band configuration by lithography and reactive ion etching.

Then, formation proceeds similarly to form four component memory layers, and the nonvolatile memory device 12 according to this example is constructed. In the case of more than four component memory layers as well, methods similar to those described above are repeated to form a nonvolatile memory device having multiple component memory layers.

Although a $ZnFe_xO_y$ film is used as the memory layer 60 in this example, any substance wherein a resistance state changes by a voltage applied to both ends may be used. For example, the materials and configurations described in regard to the first example may be used.

Although tungsten nitride is used as the electrode (the second conductive film) of the recording unit 63 in this example, various materials that do not react with the variable resistance materials of the recording unit 63 and do not degrade the variable resistance properties may be used. For example, the materials and configurations described in regard to the first example may be used.

Constraints of the metal of the rectifying element 70 are similar to those of the first example. It is desirable that Formula 3 is satisfied, and it is more desirable that Formula 4 is satisfied.

Hereinabove, methods of practicing the present invention are described using two examples; but methods of practicing the present invention are not confined thereto. Materials, including those illustrated in the examples, may be appropriately combined. In such a case as well, the effects expected of the present invention, that is, simplifying the film formation and simplifying manufacturing steps by the use of a Schottky diode, and the stack of a diode having small characteristic fluctuations during heating steps, are possible; and it is relatively easy to realize the manufacture of a highly integrated variable resistance memory.

Second Embodiment

The method for manufacturing the nonvolatile memory device according to the second embodiment of the present invention is a method for manufacturing a nonvolatile memory device including component memory layers 66 multiply stacked on one another, the component memory layer 66 including the first wiring 50, the second wiring 80 provided non-parallel to the first wiring 50, and the stacked structure unit 65 that includes the memory layer 60 and the rectifying element 70 provided between the first wiring 50 and the second wiring 80. In the method for manufacturing the nonvolatile memory device according to this embodiment, the method for manufacturing the stacked structure unit 65 that includes the memory layer 60 and the rectifying element 70, and particularly for the rectifying element 70, is distinctive. Therefore, portions thereof are described below, and the other portions may use normal manufacturing methods.

Figure 14:
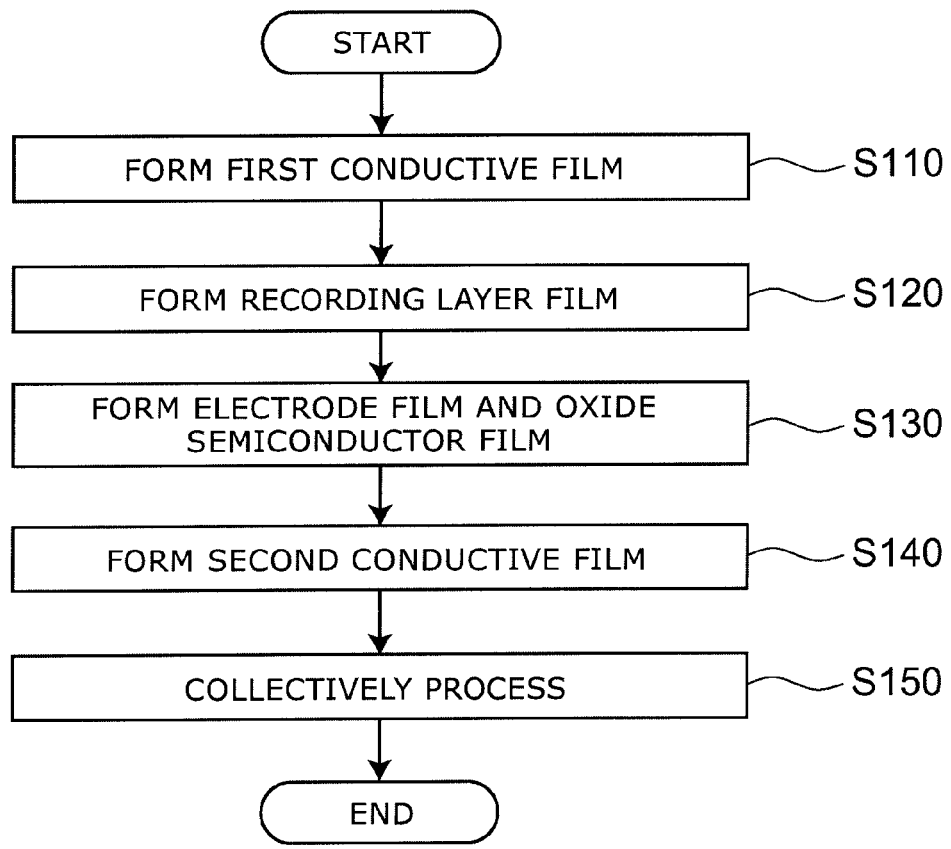
FIG. 14 is a flowchart illustrating the method for manufacturing the nonvolatile memory device according to the second embodiment of the present invention.

FIG. 14 is a flowchart illustrating the method for manufacturing the nonvolatile memory device according to the second embodiment of the present invention.

In the method for manufacturing the nonvolatile memory device according to the second embodiment of the present invention as illustrated in FIG. 14, first, a first conductive film that forms first wirings 50 is formed above a semiconductor substrate (step S110). A tungsten film and the like described above in the first and second examples, for example, can be used as the first conductive film.

A memory layer film that forms memory layers 60 is then formed (step S120). For example, the Ti-doped $NiO_x$ film described in the first example, the $ZnFe_xO_y$ film described in the second example, and the like may be used as the memory layer film.

An electrode film that forms electrodes including a metal that forms the rectifying elements 70, and an oxide semiconductor film that forms oxide semiconductors including a metal are formed (step S130). The TiN film described in the first example or the WN film described in the second example can be used as the electrode film. The oxide semiconductor film also may be a two-layer structure, and may use various materials described in the first and second examples.

Continuing, a second conductive film that forms the second wirings 80 is formed (step S140). A tungsten film and the like, for example, described in the first and second examples may be used as the second conductive film.

At least one of the first conductive film and the second conductive film is then sequentially patterned with the memory layer film, the electrode film, and the oxide semiconductor film (step S150).

Thus, the characteristics of the rectifying element 70 do not depend on the impurity concentration or the activation behavior, and the impurity profile does not vary during heating steps. Therefore, variation between each layer can be reduced even when stacked; a nonvolatile memory device having a multilayered structure can be realized; and the bit density can be increased.

Thus, the method for manufacturing the nonvolatile memory device according to this embodiment reduces the number of steps, reduces differences in levels, enables easy integration, and enables easy manufacturing of a high performance nonvolatile memory device having uniform characteristics of rectifying elements of each layer even in multiple memory layers.

Various materials that satisfy the relationships of Formula 1 to Formula 5 may be used as the electrode film and the oxide semiconductor film recited above.

Step S110 and step S140 recited above may be mutually interchanged; and step S120 and step S130 recited above may be mutually interchanged. A nonvolatile memory device having multiple component memory layers can be manufactured by repeatedly performing steps S110 to S150 recited above.

Steps S110 to S150 recited above correspond to one component memory layer. As described in the first and second examples, another step S130 and another step S120 may be performed after steps S110 to S140 to form an electrode film, an oxide semiconductor film, and a memory layer film that form another component memory layer, after which step S150 may be performed.

The manufacturing method described above may be rewritten as follows.

Figure 15:
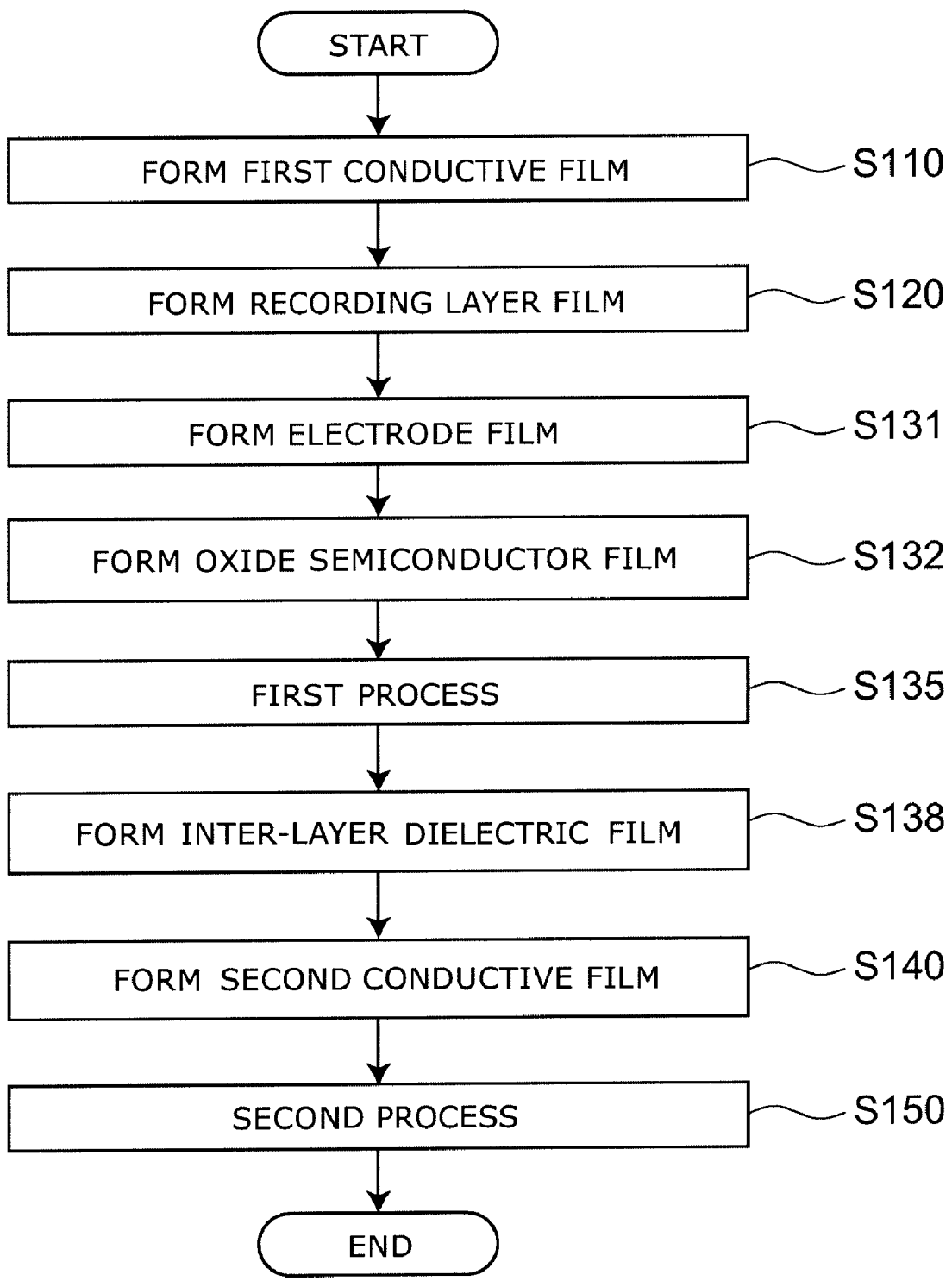
FIG. 15 is another flowchart illustrating the method for manufacturing the nonvolatile memory device according to the second embodiment of the present invention.

FIG. 15 is another flowchart illustrating the method for manufacturing the nonvolatile memory device according to the second embodiment of the present invention.

The method for manufacturing the nonvolatile memory device according to this embodiment illustrated in FIG. 15 includes: a step that forms a first conductive film that forms a first wiring 50 on a semiconductor substrate (step S110); a step that forms a memory layer film that forms a memory layer 60 (step S120); a step that forms an electrode film that forms an electrode of a rectifying element 70 (step S131); a step that forms an oxide semiconductor film that forms an oxide semiconductor 73 of the rectifying element 70 (step S132); a step that forms a second conductive film that forms a second wiring 80 (step S140); a first processing step that includes a first lithography step and patterns the first conductive film into a band configuration aligning in a first direction to form the first wiring 50 (step S135); and a second processing step that includes a second lithography step and patterns the second conductive film into a band configuration aligning in a second direction non-parallel to the first direction to form the second wiring 80 (step S150). Thus, the first processing step (step S135) includes forming the first wiring 50 and the second processing step (step S150) includes forming the second wiring 80.

At least one of the first processing step and the second processing step processes the memory layer film, the electrode film, and the oxide semiconductor film into a configuration along one of the first wiring 50 and the second wiring 80.

The processing steps recited above are mutually interchangeable to the extent of technical feasibility, and may be performed simultaneously.

This specific example includes a step (step S138) that forms the inter-layer dielectric film between step S135 and step S140.

The first processing step recited above may also include an etching step, and specifically, for example, a dry etching step.

The second processing step may also include an etching step, and specifically, for example, a dry etching step.

For example, in the manufacturing method described in the first example, the first processing step may processing the memory layer film of the first layer, the electrode film of the first layer, and the oxide semiconductor film of the first layer into a configuration along the first wiring 50 when the first conductive film is processed. The second processing step recited above may process the memory layer film of the second layer, the electrode film of the second layer, and the oxide semiconductor film of the second layer into a configuration along the second wiring 80, and process the memory layer film of the first layer, the electrode film of the first layer, and the oxide semiconductor film of the first layer into a configuration along the second wiring 60 when processing the second conductive film. Thereby, the memory layer film of the first layer, the electrode film of the first layer, and the oxide semiconductor film of the first layer are processed into a columnar configuration having a side face along the first wiring 50 and the second wiring 60.

Third Example

Figures 16A, 16B:
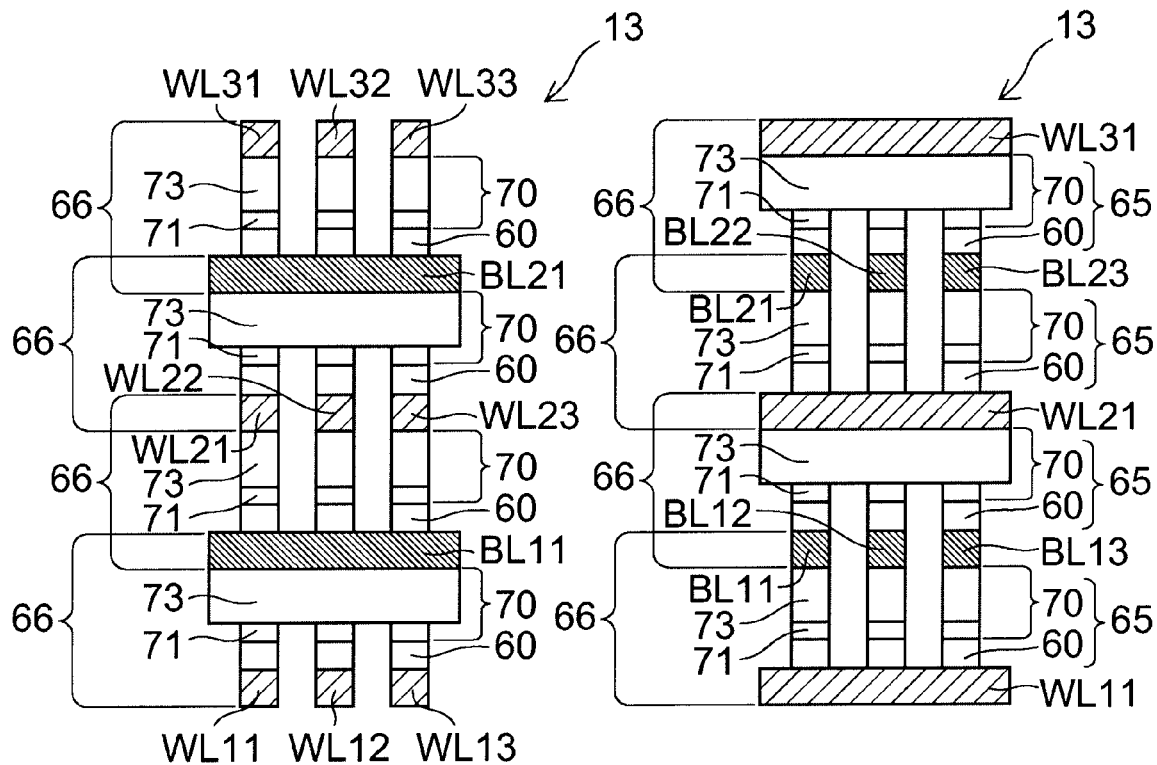
FIGS. 16A and 16B are schematic cross-sectional views illustrating a configuration of a nonvolatile memory device according to a third example of the present invention.

FIGS. 16A and 16B are schematic cross-sectional views illustrating a configuration of a nonvolatile memory device according to a third example of the present invention.

A nonvolatile memory device 13 of the third example according to this embodiment includes a stacked structure similar to the configuration illustrated in FIG. 2A. Namely, the nonvolatile memory device 13 is an example of a nonvolatile memory device having a four layered structure in which word lines WL11, WL12, and WL13 are provided on a lowermost layer; bit lines BL11, BL12, and BL13 are provided thereabove; word lines WL21, WL22, and WL23 are provided thereabove; bit lines BL21, BL22, and BL23 are provided thereabove; word lines WL31, WL32, and WL33 are provided thereabove; and the stacked structure unit 65 that includes the memory layer 60 and the rectifying element 70 is provided therebetween. In this example, the first wiring 50 is a word line and the second wiring 80 is a bit line.

In the nonvolatile memory device 13, the oxide semiconductor layer 73 of the rectifying element 70 is formed into a band configuration along a word line or a bit line (one of the first wiring 50 and the second wiring 80); and the electrode 71 of the rectifying element 70 is formed in columnar configurations separated for each cell. In other words, in a Schottky diode, a film (the oxide semiconductor layer 73) that forms the diode is a dielectric film and thereby a function as a diode can be obtained even without being processed for each cell. This function is utilized in this example such that the oxide semiconductor layer 73 of the diode is only processed into a band configuration (band configuration) simultaneous with a wiring, thereby providing the advantage that the aspect ratio of the processing step can be reduced.

Figure 17:
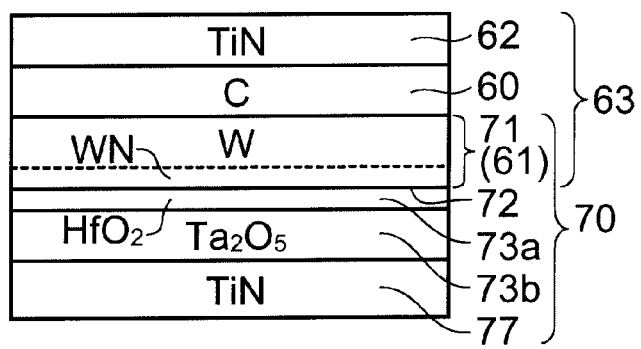
FIG. 17 is a schematic cross-sectional view illustrating a configuration of main components of the nonvolatile memory device according to the third example of the present invention.

FIG. 17 is a schematic cross-sectional view illustrating a configuration of main components of the nonvolatile memory device according to the third example of the present invention.

In the rectifying element 70 of the nonvolatile memory device 13 according to this example as illustrated in FIG. 17, the forward-direction electrode 77, the second oxide semiconductor layer 73b, the first oxide semiconductor layer 73a, and the electrode 71 are stacked. A Schottky junction is formed at an interface (the Schottky interface 72) between the electrode 71 and the first oxide semiconductor layer 73a.

In this example, the electrode 71 includes, for example, a WN film on the first oxide semiconductor layer 73a side and a W film on a side opposite to the first oxide semiconductor layer 73a. The electrode 71 of the rectifying element 70 is shared as the first conductive layer 61 of the recording unit 63.

The first oxide semiconductor layer 73a side of the electrode 71 is the WN film; $HfO_2$, for example, is used as the first oxide semiconductor layer 73a; and $Ta_2O_5$, for example, is used as the second oxide semiconductor layer 73b. Formula 3 and Formula 4 recited above are thereby satisfied.

Here, the first oxide semiconductor layer 73a and the second oxide semiconductor layer 73b of the Schottky diode are insulators when solitary. Therefore, in this example, the first oxide semiconductor layer 73a and the second oxide semiconductor layer 73b are patterned into a band configuration collectively with the electrode 71, but are not collectively patterned with the forward-direction electrode 77. The processing of the Schottky diode portion is thus omitted, enabling easier processing and a lower aspect ratio during processing.

C (carbon) is used as the memory layer 60, and TiN is used as the second conductive layer 62 of the recording unit 63. A WN/W laminated layer film is used as the first conductive layer 61 of the recording unit 63, which is shared as the electrode 71.

In the description above, the WN film may be considered as the electrode 71; the W film described as being included in the electrode 71 may be considered as the first conductive layer 61; and the electrode 71 and the first conductive layer 61 may be considered to be not shared but independent.

Thus, by using a Schottky diode as the rectifying element 70 in the nonvolatile memory device 13 according to this example, the rectifying element 70 is not further processed into a columnar configuration. Therefore, it is easy to reduce differences in levels and reduce the number of steps.

By appropriately selecting the materials used as the electrode 71, the first oxide semiconductor layer 73a, and the second oxide semiconductor layer 73b of the rectifying element 70, Formula 3 and Formula 4 are satisfied. It is thereby possible to inhibit the materials from reacting and degrading. Effects of heating steps can be thereby inhibited as much as possible, providing uniform characteristics of the stacked diodes and realizing excellent cell characteristics.

Thus, the nonvolatile memory device 13 according to this example reduces the number of steps, reduces differences in levels, enables easy integration, and enables easy manufacturing of a high performance nonvolatile memory device having uniform characteristics of rectifying elements of each layer even in multiple memory layers.

A method for manufacturing the nonvolatile memory device 13 will now be described.

FIGS. 18A and 18B are schematic cross-sectional views in order of the steps, illustrating the method for manufacturing the nonvolatile memory device according to the third example of the present invention.

FIGS. 19A and 19B are schematic cross-sectional views in order of the steps continuing from FIG. 18B.

Figure 20A:
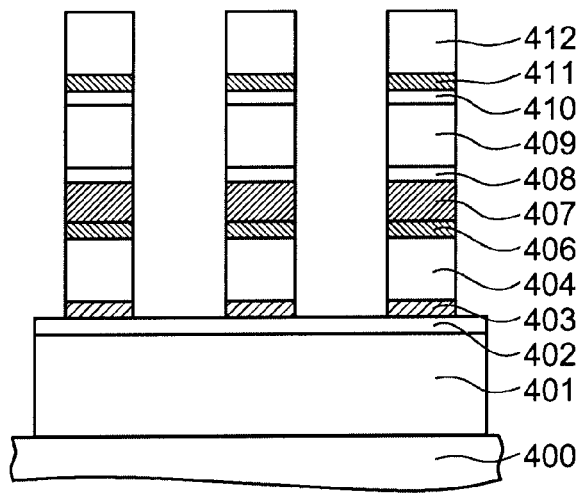
FIGS. 20A and 20B are schematic cross-sectional views in order of the steps continuing from FIG. 19B.
Figure 20B:
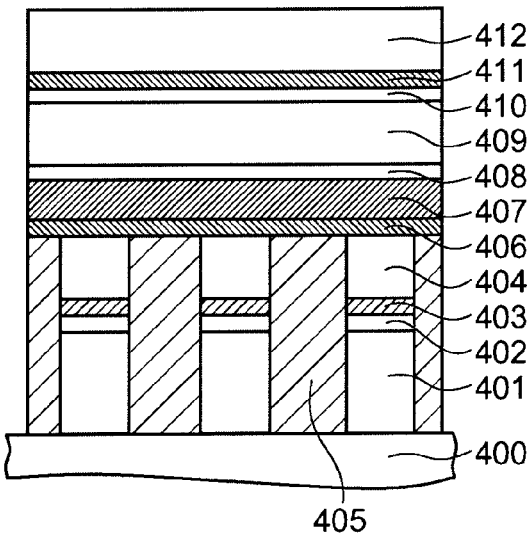

FIGS. 20A and 20B are schematic cross-sectional views in order of the steps continuing from FIG. 19B.

Figure 21A:
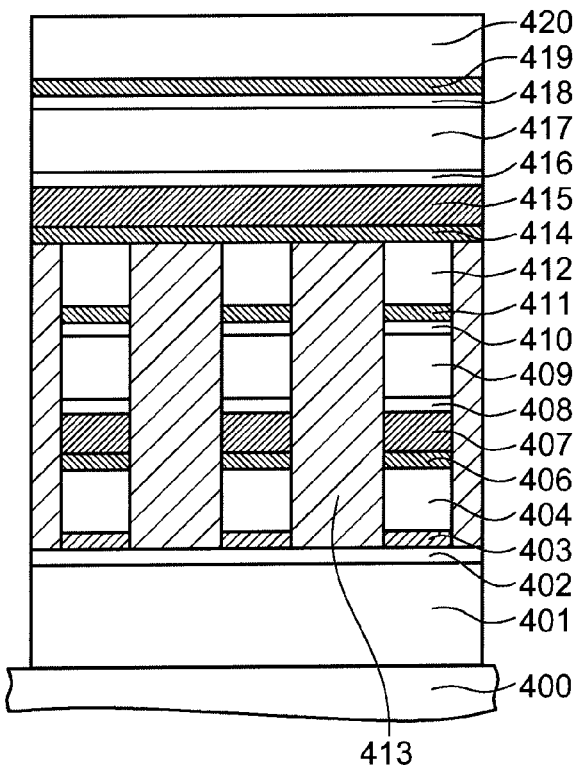
FIGS. 21A and 21B are schematic cross-sectional views in order of the steps continuing from FIG. 20B.
Figure 21B:
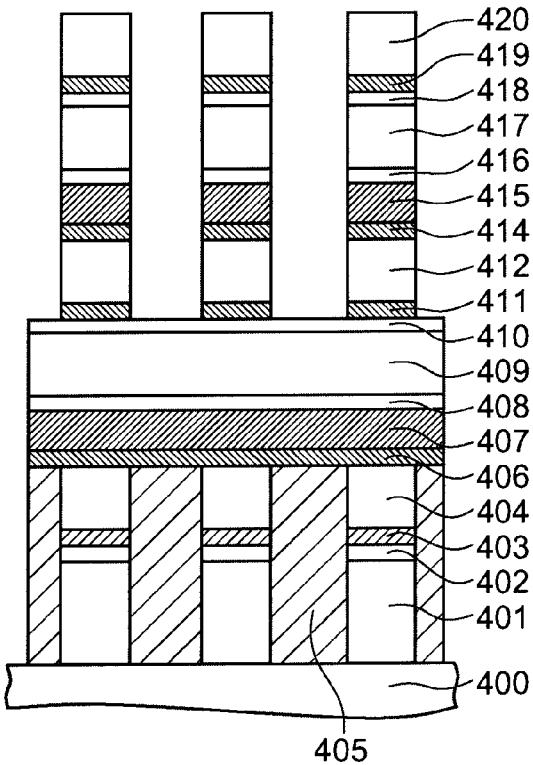

FIGS. 21A and 21B are schematic cross-sectional views in order of the steps continuing from FIG. 20B.

In each of these drawings, the drawing on the left side is a cross-sectional view in the bit line direction, that is, a cross-sectional view cut along a plane perpendicular to the aligning direction of the bit lines; and the drawing on the right side is a cross-sectional view in the word line direction, that is, a cross-sectional view cut along a plane perpendicular to the aligning direction of the word lines.

First, as illustrated in FIGS. 18A and 18B, a tungsten film 401 that forms word lines of the nonvolatile memory device is formed with a thickness of 70 nm above a semiconductor substrate (substrate) 400.

Similar to the first example, the word lines need not be word lines of the lowermost layer of the stacked memory, and may be word lines of stacked upper layers.

Sequentially, a titanium nitride film 402 that forms electrodes (the second conductive layer 62 which also functions as barrier metal) of the recording unit 63 is then formed with a thickness of 10 nm; a C film 403 that forms memory layers 60 is formed with a thickness of 10 nm; a WN/W stacked film 404 that forms electrodes (the first conductive layer 61 which is shared as the electrode 71 of the rectifying element 70) of the recording unit 63 is formed as a WN film with a thickness of 10 nm and a W film with a thickness of 50 nm in this order; and the configuration is patterned into a band configuration by lithography and reactive ion etching.

Continuing as illustrated in FIGS. 19A and 19B, an interlayer dielectric film 405 is filled between the stacked films processed into the band configuration, and planarized by CMP with the WN/W stacked film 404 as a stopper.

As illustrated in FIGS. 20A and 20B, a hafnia ($HfO_2$) film 406 that forms the first oxide semiconductor layer 73a of the rectifying element 70 is then formed with a thickness of 5 nm on the entire surface of the configuration (substrate); sequentially thereupon, a $Ta_2O_5$ film 407 that forms the second oxide semiconductor layer 73b of the rectifying element 70 is formed with a thickness of 20 nm; a titanium nitride (TiN) film 408 that forms the forward-direction electrode 77 of the rectifying element 70 is formed with a thickness of 10 nm; a tungsten film 409 that forms bit lines is formed with a thickness of 70 nm; a titanium nitride film 410 that forms the second conductive layer 62 of the recording units 63 of the second layer memory cells is formed with a thickness of 10 nm; a C film 411 that forms the memory layers 60 is formed with a thickness of 10 nm; and a WN/W stacked film 412 (a film shared as the electrode 71 of the rectifying element 70) is formed as a WN film with a thickness of 10 nm and a W film with a thickness of 50 nm in this order.

The stacked films are collectively patterned into a band configuration to the hafnia ($HfO_2$) film 406 by lithography and reactive ion etching; and further, the lower layers of the WN/W stacked film 404 and the C film 403 are collectively sequentially patterned. It is not necessary to pattern the inter-layer dielectric film 405.

Then, as illustrated in FIGS. 21A and 21B, an inter-layer dielectric film 413 is filled between the stacked films processed into the band configuration, and planarized by CMP with the WN/W stacked film 411 as a stopper; and a first layer of the memory cell is thereby formed.

Continuing as illustrated in FIGS. 21A and 21B, a hafnia (HfO$_2$) film 414 that forms the first oxide semiconductor layer 73a of the rectifying elements 70 is formed with a thickness of 5 nm on the entire surface of the configuration (substrate); sequentially thereupon, a Ta$_2$O$_5$ film 415 that forms the second oxide semiconductor layer 73b of the rectifying elements 70 is formed with a thickness of 20 nm; a titanium nitride (TiN) film 416 that forms the forward-direction electrodes 77 of the rectifying elements 70 is formed with a thickness of 10 nm; a tungsten film 417 that forms bit lines is formed with a thickness of 70 nm; a titanium nitride film 418 that forms the recording units 63 of the second layer of memory cells is formed with a thickness of 10 nm; a C film 419 that forms the memory layers 60 is formed with a thickness of 10 nm; a WN/W stacked film 420 is formed as a WN film with a thickness of 10 nm and a W film with a thickness of 50 nm in this order; and the stacked films are collectively patterned into a band configuration by lithography and reactive ion etching, thereby forming a second layer component memory layer.

Then, formation proceeds similarly to form four component memory layers, and the nonvolatile memory device 13 according to this example is constructed. In the case of more than four layers as well, methods similar to those described above are repeated to form a nonvolatile memory device having multiple component memory layers.

Figure 22:
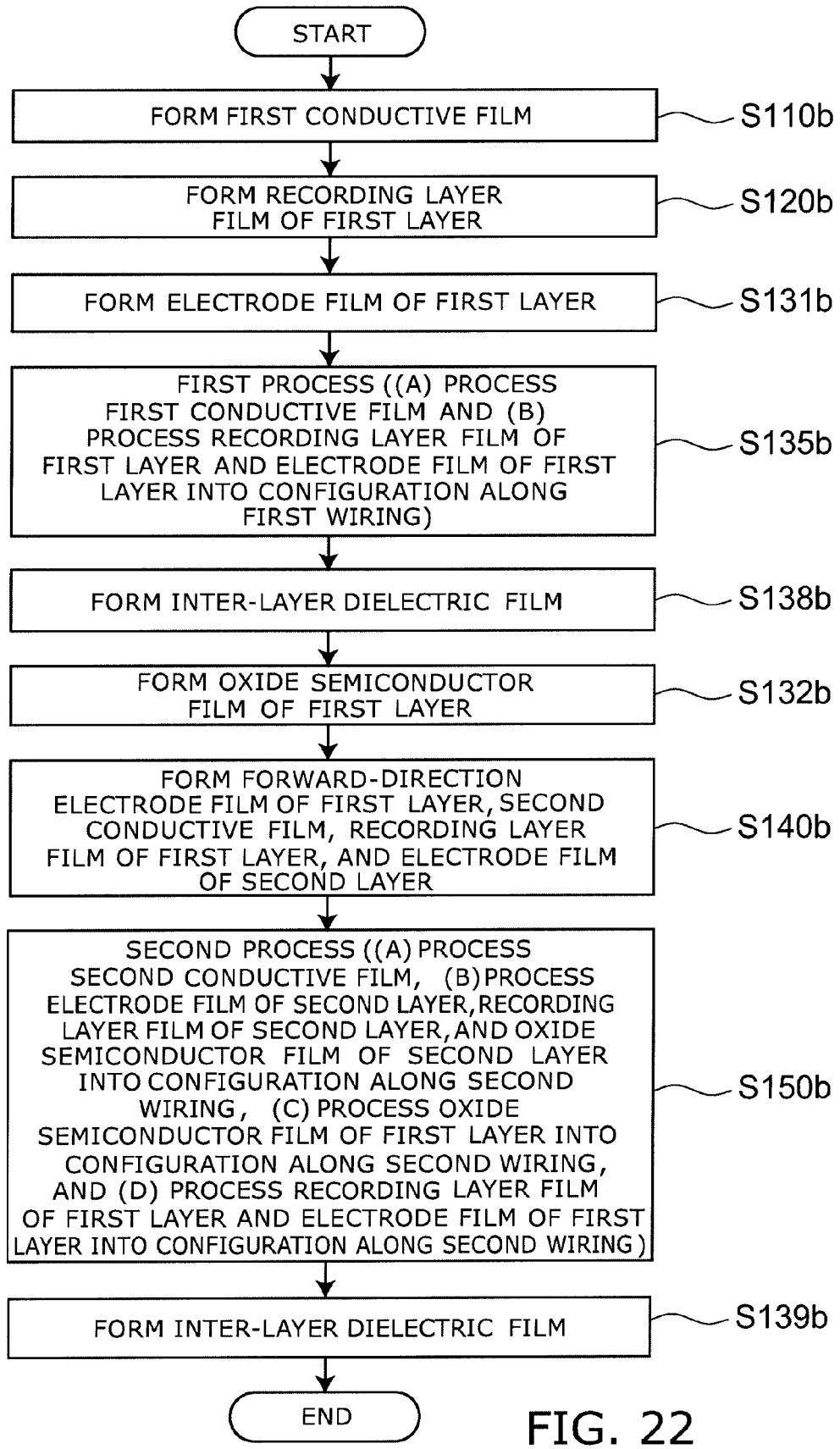
FIG. 22 is a flowchart illustrating the method for manufacturing the nonvolatile memory device according to an embodiment of the present invention.

FIG. 22 is a flowchart illustrating the method for manufacturing the nonvolatile memory device according to an embodiment of the present invention.

Namely, FIG. 22 illustrates the manufacturing method described in regard to the third example described above. The order of step S132, step S140, and step S150 illustrated in FIG. 15 is interchanged.

As illustrated in FIG. 22, a step that forms the first conductive film that forms the first wirings 50 (word lines) on the semiconductor substrate (step S110b), a step that forms the memory layer film of a first layer that forms the memory layers 60 of the first layer (step S120b), a step that forms an electrode film (for example, the WN/W stacked film shared as the first conductive layers 61 of the recording units 63) that forms the electrodes 71 of the rectifying elements 70 of the first layer (step S131b), and a first processing step (step S135b) are performed.

The first processing step processes the memory layer film of the first layer and the electrode film of the first layer into a band configuration along the first wirings 50, simultaneously processing the first conductive film.

In other words, for example, the processing described in regard to FIGS. 18A and 18B is performed.

Then, the inter-layer dielectric film is filled between the stacked films processed into the band configuration, and planarized (step S138b).

In other words, for example, the processing described in regard to FIGS. 19A and 19B is performed.

An oxide semiconductor film that forms the oxide semiconductors 73 of the rectifying elements 70 of the first layer is then formed (step S132b).

Continuing, a forward-direction electrode film that forms the forward-direction electrodes 77 of the rectifying elements 70, a second conductive film that forms the second wirings 80 (bit line), a memory layer film of the second layer that forms the memory layers 60 of the second layer, and an electrode film that forms the electrodes 73 of the rectifying elements 70 of the second layer are formed (step S140b). This step corresponds to step S140 illustrated in FIG. 15.

A second processing step (step S150b) is then performed. In this step, first, an electrode film of the second layer that forms the memory layers 60 of the second layer, a memory layer film of the second layer, and an oxide semiconductor film of the second layer are patterned into a band configuration along the second wirings 80. Continuing, the oxide semiconductor film of the first layer is patterned into a band configuration along the second wirings 80.

Then, the memory layer film of the first layer and the electrode film of the first layer are further processed into a configuration along the second wirings 80. The memory layer film of the first layer and the electrode film of the first layer are thereby processed into a columnar configuration having a side face along the first wirings 50 and the second wirings 80.

In other words, for example, the processing described in regard to FIGS. 20A and 20B is performed.

Then, an inter-layer dielectric film is filled between the stacked films collectively patterned into the band configuration, and planarized (step S139b).

The steps recited above are then repeated to form stacked memory cells.

The first processing step described above is a step that processes the memory layer film of the first layer and the electrode film of the first layer into a configuration along the first wirings 50. The second processing step is a step that processes the memory layer film of the first layer, the electrode film of the first layer, and the oxide semiconductor layer of the first layer into a configuration along the second wirings, and processes the oxide semiconductor film of the first layer into a band configuration along the second wirings 80 while processing the memory layer of the first layer and the electrode film of the first layer into a columnar configuration.

Although a C film is used as the memory layer 60 in this example, any material wherein a voltage applied to both ends causes the resistance state to change may be used. For example, the materials and configurations described in regard to the first example may be used.

Although titanium nitride was used as the electrode (the second conductive film) of the recording unit 63 in this example, various materials that do not react with the variable resistance material used as the recording unit 63 and compromise the variable resistance properties may be used. For example, the materials and configurations described in regard to the first example may be used.

Constraints of the metal of the rectifying element 70 are similar to those of the first example. It is desirable that Formula 3 is satisfied, and it is more desirable that Formula 4 is satisfied.

Fourth Example

Figures 23A, 23B:
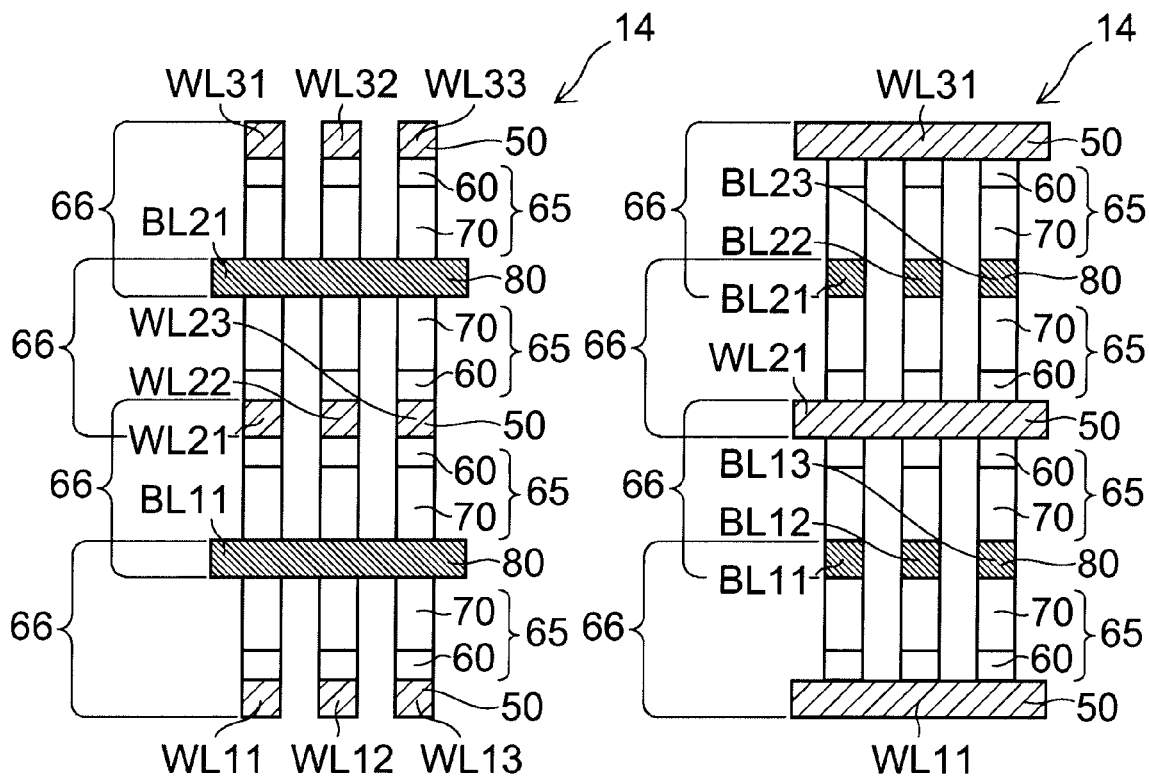
FIGS. 23A and 23B are schematic cross-sectional views illustrating a configuration of a nonvolatile memory device according to a fourth example of the present invention.

FIGS. 23A and 23B are schematic cross-sectional views illustrating a configuration of a nonvolatile memory device according to a fourth example of the present invention.

A nonvolatile memory device 14 of the fourth example according to an embodiment of the present invention includes a stacked structure similar to the configuration illustrated in FIG. 2A. Namely, the nonvolatile memory device 14 is an example of a nonvolatile memory device having a four layered structure in which word lines WL11, WL12, and WL13 are provided on a lowermost layer; bit lines BL11, BL12, and BL13 are provided thereabove; word lines WL21, WL22, and WL23 are provided thereabove; bit lines BL21, BL22, and BL23 are provided thereabove; word lines WL31, WL32, and WL33 are provided thereabove; and the stacked structure unit 65 that includes the memory layer 60 and the rectifying element 70 is provided therebetween. In this example, the first wiring 50 is a word line and the second wiring 80 is a bit line.

However, this example is different than the first, second, and third examples in that the stacked structure unit 65 that includes the memory layer 60 and the rectifying element 70 is processed separately from the word line and the bit line. Therefore, the word line and the bit line can be formed as damascene wirings by filling a metal film into pre-made trenches by CVD and then performing CMP; processing is necessary only for the stacked structure unit 65; and an advantage is provided that the processing aspect ratio is relatively low.

Figure 24:
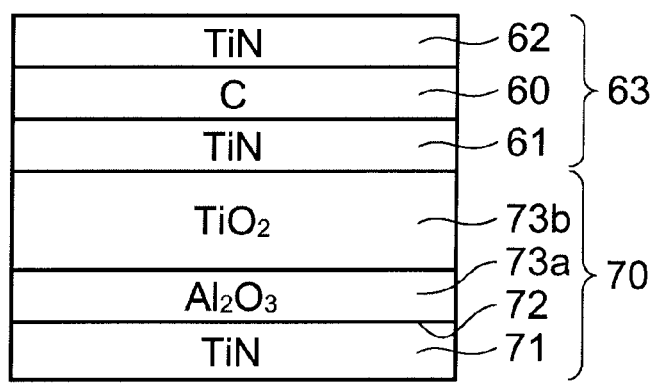
FIG. 24 is a schematic cross-sectional view illustrating a configuration of main components of the nonvolatile memory device according to the fourth example of the present invention.

FIG. 24 is a schematic cross-sectional view illustrating a configuration of main components of the nonvolatile memory device according to the fourth example of the present invention.

The electrode 71, the first oxide semiconductor layer 73a, and the second oxide semiconductor layer 73b are stacked in the rectifying element 70 of the nonvolatile memory device 14 according to this example as illustrated in FIG. 24.

A Schottky junction is formed at an interface (the Schottky interface 72) between the electrode 71 and the first oxide semiconductor layer 73a. Restated, the electrode 71 and the first oxide semiconductor layer 73a form a Schottky junction.

In this example, TiN, for example, is used as the electrode 71; $Al_2O_3$, for example, is used as the first oxide semiconductor layer 73a; and $TiO_2$, for example, is used as the second oxide semiconductor layer 73b.

Formula 3 and Formula 4 recited above are thereby satisfied.

C (carbon) is used as the memory layer 60, and TiN is used as the first conductive layer 61 and the second conductive layer 62 of the recording unit 63.

Thus, Formula 3 and Formula 4 are satisfied by appropriately selecting materials used as the electrode 71, the first oxide semiconductor layer 73a, and the second oxide semiconductor layer 73b of the rectifying element 70. It is thereby possible to inhibit the materials from reacting and degrading. Effects of heating steps can be thereby inhibited as much as possible, providing uniform characteristics of the stacked diodes and realizing excellent cell characteristics.

Thus, the nonvolatile memory device 14 according to this example reduces the number of steps, reduces differences in levels, enables easy integration, and enables easy manufacturing of a high performance nonvolatile memory device having uniform characteristics of rectifying elements of each layer even in multiple memory layers.

A method for manufacturing the nonvolatile memory device 14 will now be described.

Figure 25A:
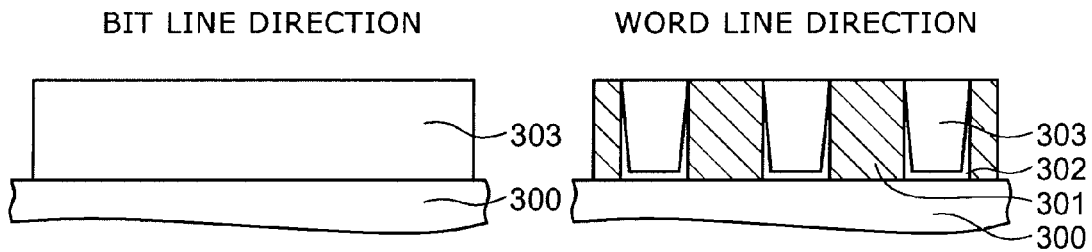
FIGS. 25A to 25C are schematic cross-sectional views in order of the steps, illustrating the method for manufacturing the nonvolatile memory device according to the fourth example of the present invention.
Figure 25B:
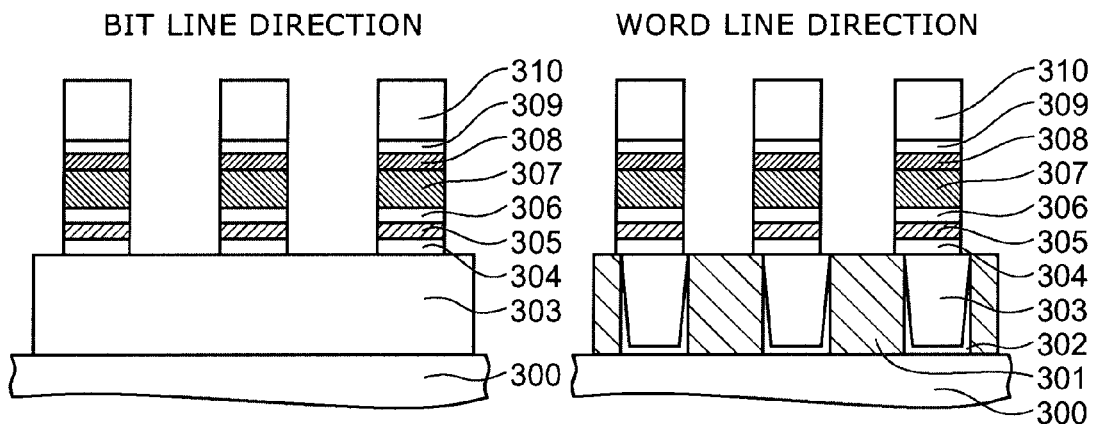
Figure 25C:
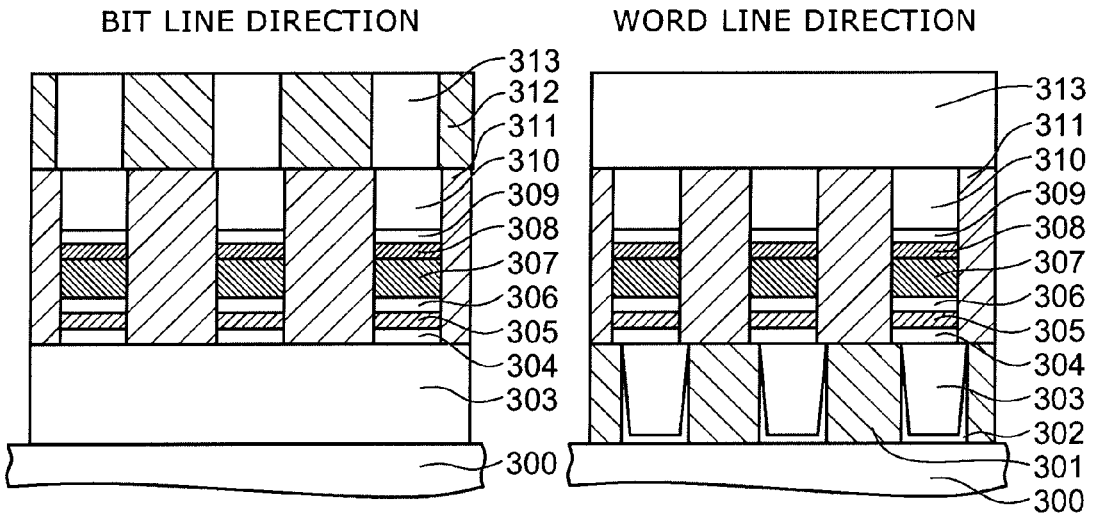

FIGS. 25A to 25C are schematic cross-sectional views in order of the steps, illustrating the method for manufacturing the nonvolatile memory device according to the fourth example of the present invention.

Figure 26A:
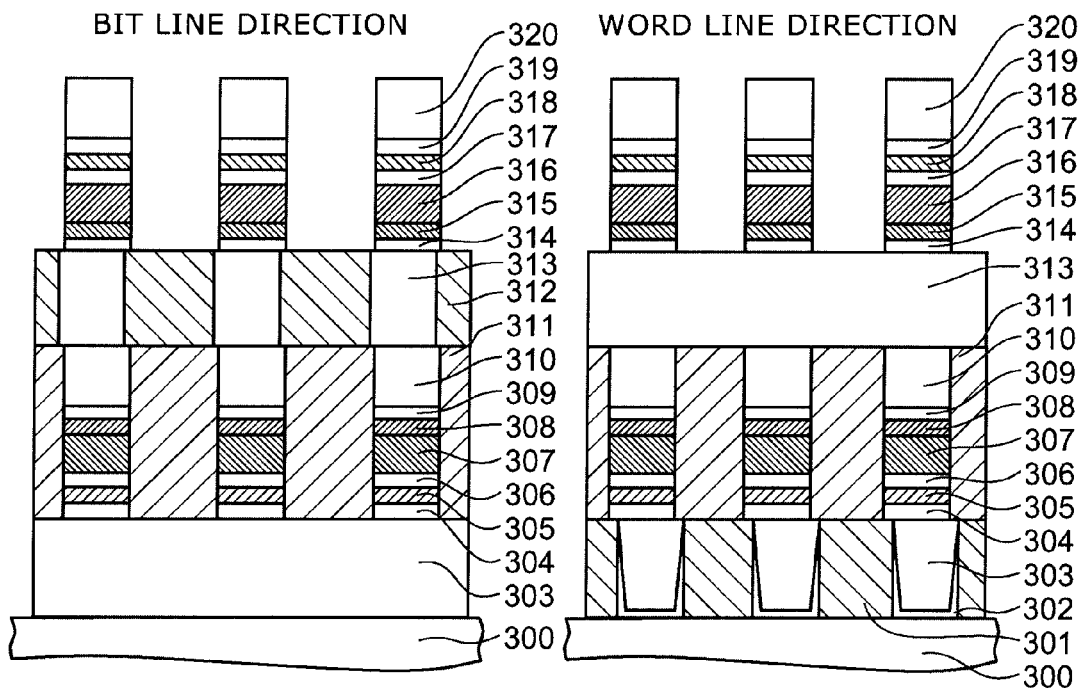
FIGS. 26A and 26B are schematic cross-sectional views in order of the steps continuing from FIG. 25C.
Figure 26B:
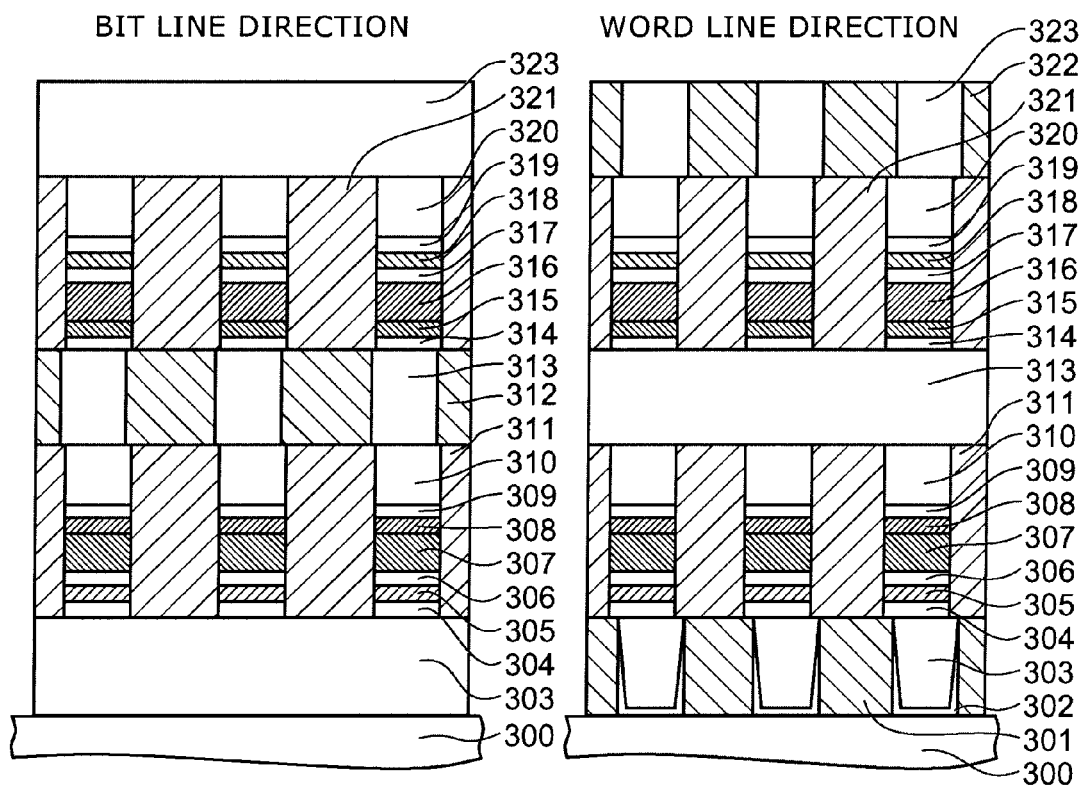

FIGS. 26A and 26B are schematic cross-sectional views in order of the steps continuing from FIG. 25C.

In each of these drawings, the drawing on the left side is a cross-sectional view in the bit line direction, that is, a cross-sectional view cut along a plane perpendicular to the aligning direction of the bit lines; and the drawing on the right side is a cross-sectional view in the word line direction, that is, a cross-sectional view cut along a plane perpendicular to the aligning direction of the word lines.

First, as illustrated in FIG. 25A, an inter-layer dielectric film (ILD) 301 is formed above a semiconductor substrate (substrate) 300 to define trenches as a mold for word lines. A TiN film 302 is formed with a thickness of 10 nm by sputtering as barrier metal; a tungsten film 303 that forms the word lines of the nonvolatile memory device is formed with a thickness of 70 nm, completely filling the trenches.

The TiN film 302 and the tungsten film 303 on the inter-layer dielectric film 301 are removed by CMP to form the word lines of the nonvolatile memory device.

Similar to the first example, the word lines need not be word lines of the lowermost layer of the stacked memory, and may be word lines of stacked upper layers.

Then, as illustrated in FIG. 25B, a titanium nitride film 304 that forms lower electrodes (the second conductive layer 62 which also functions as barrier metal) of the recording units 63 is formed with a thickness of 10 nm; a C film 305 that forms the memory layers 60 is formed with a thickness of 10 nm; a titanium nitride film 306 that forms upper electrodes of the recording units 63 is formed with a thickness of 10 nm; titania ($TiO_2$) film 307 that forms the second oxide semiconductor layer 73b of the rectifying element 70 is formed with a thickness of 20 nm; an alumina ($Al_2O_3$) film 308 that forms the first oxide semiconductor layer 73a of the rectifying element 70 is formed with a thickness of 10 nm; a titanium nitride film 309 that forms the electrode 71 of the rectifying element 70 is formed with a thickness of 10 nm; and a tungsten film 310 that forms a CMP stopper is formed with a thickness of 50 nm.

Although the alumina film 308 that forms the first oxide semiconductor layer 73a functions to form a good Schottky junction with the electrode 71 formed by the titanium nitride film 309, the first oxide semiconductor layer 73a (the hafnia film 205) may be omitted by forming the electrode 71 by a material such as Pt, Au, Ir, Ru, Re, and the like having a free energy per unit metal atom of the oxide thereof higher than that of W. In such a case, the film thickness of the titania film that forms the second oxide semiconductor layer 73b is made thicker than that of this example to alleviate the electric field applied to the Schottky junction. In such a case, the oxide semiconductor is a one-layer structure (the titania film 307), and Formula 1 is satisfied with the electrode 71 (the tungsten nitride film 206).

The stacked films are then collectively patterned into a columnar configuration by lithography and reactive ion etching.

Then, as illustrated in FIG. 25C, an inter-layer dielectric film 311 is filled between the stacked films processed into the columnar configuration, and planarized by CMP with the tungsten film 310 as a stopper.

Continuing, an inter-layer dielectric film 312 is formed on the entire surface of the substrate, and trenches are made by lithography and reactive ion etching to form a mold for bit lines.

A tungsten film 313 that forms bit lines is then filled and planarized by CMP to form the bit lines.

Then, as illustrated in FIG. 26A, a titanium nitride film 314 that forms the electrodes 71 of the rectifying elements 70 is formed with a thickness of 10 nm on the entire surface of the configuration (substrate); thereupon, an alumina film 315 that forms the first oxide semiconductor layer 73a of the rectifying elements 70 is formed with a thickness of 10 nm; a titania film 316 that forms the second oxide semiconductor layer 73b of the rectifying elements 70 is formed with a thickness of 20 nm; a titanium nitride film 317 that forms lower electrodes of the recording units 63 is formed with a thickness of 10 nm; a C film 318 that forms the memory layers 60 is formed with a thickness of 10 nm; a titanium nitride film 319 that forms electrodes of the recording units 63 is formed with a thickness of 10 nm; and a tungsten film 320 that forms a CMP stopper is formed with a thickness of 50 nm.

The stacked films are collectively patterned into a columnar configuration by lithography and reactive ion etching.

As illustrated in FIG. 26B, an inter-layer dielectric film 321 is filled between the stacked films processed into the columnar configuration, and planarized by CMP with the tungsten film 320 as a stopper. An inter-layer dielectric film 322 is then formed on the entire surface of the configuration (substrate); trenches are made by lithography and reactive ion etching to form a mold for word lines; and a tungsten film 323 that forms word lines is filled and planarized by CMP to for the word lines. Two component memory layers are thereby formed.

Then, formation proceeds similarly to form four component memory layers, and the nonvolatile memory device 13 according to this example is constructed. In the case of more than four layers as well, methods similar to those described above are repeated to form a nonvolatile memory device having multiple component memory layers.

Figure 27:
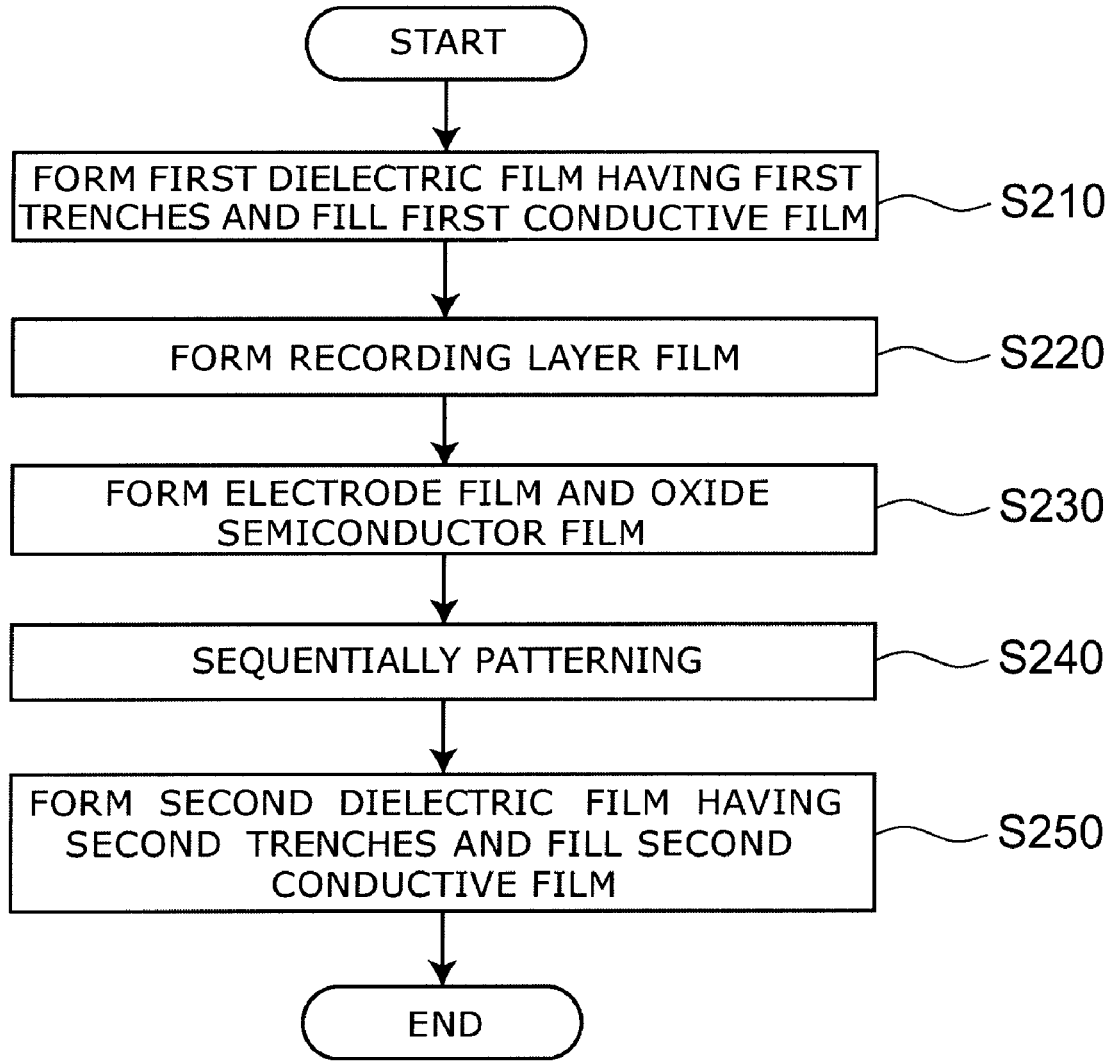
FIG. 27 is a flowchart illustrating the method for manufacturing the nonvolatile memory device according to an embodiment of the present invention

FIG. 27 is a flowchart illustrating the method for manufacturing the nonvolatile memory device according to an embodiment of the present invention.

Namely, FIG. 27 illustrates the manufacturing method described in regard to the fourth example described above.

As illustrated in FIG. 27, a first dielectric film having first trenches is formed on a semiconductor substrate, and a first conductive film that forms the first wirings is filled into the first trenches (step S210).

In other words, for example, the processing described in regard to FIG. 25A is performed.

Then, a memory layer film that forms the memory layers 60 is formed (step S220).

An electrode film that forms electrodes of the rectifying elements 70 and an oxide semiconductor film that forms the oxide semiconductors of the rectifying elements are formed (step S230).

Continuing, the memory layer film, the electrode film, and the oxide semiconductor film are collectively processed sequentially patterned) into a columnar configuration (step S240). That is, the collective patterning cuts along a plane including a direction perpendicular to both the aligning direction of the first wirings (for example, the word lines) and the aligning direction of the second wirings (for example, the bit lines), and the aligning direction of the first wirings; and along a plane including the perpendicular direction and the aligning direction of the second wirings.

In other words, the processing described in regard to FIG. 25B is performed.

Then, an inter-layer dielectric film is filled between the memory layer film, the electrode film, and the oxide semiconductor film that were collectively patterned; a second dielectric film having second trenches is formed above the memory layer film, the electrode film, the oxide semiconductor film, and the inter-layer dielectric film; and a second conductive film that forms the second wirings is filled into the second trenches (step S250).

In other words, the processing described in regard to FIG. 25C is performed.

Thus, the word lines and the bit lines, for example, can be formed with a damascene wiring structure by filling a metal film into pre-made trenches and performing CMR The processing of the stacked structure units 65 thereby is performed separate from the formation of the word lines and the bit lines.

Therefore, the processing aspect ratio is relatively low, and the element density improves.

Although a C film is used as the memory layer 60 in this example, any material wherein a voltage applied to both ends causes the resistance state to change may be used. For example, the materials and configurations described in regard to the first example may be used.

Although titanium nitride was used as the electrode (the second conductive film) of the recording unit 63 in this example, various materials that do not react with the variable resistance material used as the recording unit 63 and do not degrade the variable resistance properties may be used. For example, the materials and configurations described in regard to the first example may be used.

Constraints of the metal in the rectifying element 70 are similar to those of the first example. It is desirable that Formula 3 is satisfied, and it is more desirable that Formula 4 is satisfied.

The present invention enables further future progress of improvements to integration of nonvolatile memory, and therefore wider ranges of applications of nonvolatile memory can be expected hereafter.

Hereinabove, embodiments of the present invention are described with reference to specific examples. However, the present invention is not limited to these specific examples. For example, one skilled in the art may appropriately select specific configurations of components of the nonvolatile memory device and the method for manufacturing the same from known art and similarly practice the present invention. Such practice is included in the scope of the present invention to the extent that similar effects thereto are obtained.

Further, any two or more components of the specific examples may be combined within the extent of technical feasibility; and are included in the scope of the present invention to the extent that the purport of the present invention is included.

Moreover, all nonvolatile memory devices and methods for manufacturing the same that can be obtained by an appropriate design modification by one skilled in the art based on the nonvolatile memory devices and the methods for manufacturing the same described above as embodiments of the present invention also are within the scope of the present invention to the extent that the purport of the present invention is included.

Furthermore, various modifications and alterations within the spirit of the present invention will be readily apparent to those skilled in the art. All such modifications and alterations should therefore be seen as within the scope of the present invention.

The invention claimed is:

1. A nonvolatile memory device comprising a plurality of component memory layers stacked on one another, each of the plurality of component memory layers including:
   a first wiring;
   a second wiring provided non-parallel to the first wiring; and
   a stacked structure unit provided between the first wiring and the second wiring, the stacked structure unit having a memory layer and a rectifying element;
   the rectifying element having a Schottky junction formed on an interface between an electrode and an oxide semiconductor, the electrode including a metal, the oxide semiconductor including a metal,
   wherein the rectifying element further includes a forward-direction electrode provided on the oxide semiconductor on a side opposite to the electrode, and a free energy per unit metal atom of an oxide of a metal included in the forward-direction electrode is not more than a free energy per unit metal atom of an oxide of the metal included in the oxide semiconductor.

2. The device according to claim 1, wherein a Gibbs free energy per unit metal atom of an oxide of the metal included in the oxide semiconductor is lower than a Gibbs free energy per unit metal atom of an oxide of the metal included in the electrode.

3. The device according to claim 1, wherein the electrode includes at least one selected from the group consisting of an oxide, a nitride, a silicide, and a carbide of the metal included in the electrode.

4. The device according to claim 1, wherein a work function of the electrode is larger than a work function of the oxide semiconductor.

5. A nonvolatile memory device comprising a plurality of component memory layers stacked on one another, each of the plurality of component memory layers including:
a first wiring;
a second wiring provided non-parallel to the first wiring; and
a stacked structure unit provided between the first wiring and the second wiring, the stacked structure unit having a memory layer and a rectifying element;
the rectifying element having a Schottky junction formed on an interface between an electrode and an oxide semiconductor, the electrode including a metal, the oxide semiconductor including a metal,
wherein the oxide semiconductor includes:
a second oxide semiconductor layer including a metal; and
a first oxide semiconductor layer including a metal and provided between the second oxide semiconductor layer and the electrode, and
a Gibbs free energy per unit metal atom of an oxide of the metal included in the first oxide semiconductor layer is lower than a Gibbs free energy per unit metal atom of an oxide of the metal included in the electrode.

6. A nonvolatile memory device comprising a plurality of component memory layers stacked on one another, each of the plurality of component memory layers including:
a first wiring;
a second wiring provided non-parallel to the first wiring; and
a stacked structure unit provided between the first wiring and the second wiring, the stacked structure unit having a memory layer and a rectifying element;
the rectifying element having a Schottky junction formed on an interface between an electrode and an oxide semiconductor, the electrode including a metal, the oxide semiconductor including a metal,
wherein the oxide semiconductor includes:
a second oxide semiconductor layer including a metal; and
a first oxide semiconductor layer including a metal and provided between the second oxide semiconductor layer and the electrode, and
a Gibbs free energy per unit metal atom of an oxide of the metal included in the second oxide semiconductor layer is higher than a Gibbs free energy per unit metal atom of an oxide of the metal included in the first oxide semiconductor layer.

7. The device according to claim 1, wherein the oxide semiconductor includes:
a second oxide semiconductor layer including a metal; and
a first oxide semiconductor layer including a metal and provided between the second oxide semiconductor layer and the electrode,
the rectifying element further includes a forward-direction electrode provided on the second oxide semiconductor layer on a side opposite to the electrode, and
a free energy per unit metal atom of an oxide of the metal included in the forward-direction electrode is not more than a free energy per unit metal atom of an oxide of the metal included in the second oxide semiconductor layer.

8. The device according to claim 1, wherein the rectifying element has a band configuration integrated with the first wiring or the second wiring, and
the band configuration is formed to extend along the first wiring or the second wiring.

9. The device according to claim 5, wherein the oxide semiconductor includes:
a second oxide semiconductor layer including a metal; and
a first oxide semiconductor layer including a metal and provided between the second oxide semiconductor layer and the electrode,
the electrode includes at least one of TaN and TiN,
the first oxide semiconductor layer includes at least one of $HfO_2$, $ZrO_2$, and $Al_2O_3$, and
the second oxide semiconductor layer includes at least one of $Ta_2O_5$, $Nb_2O_5$, $V_2O_3$, $MnO_2$ and $TiO_2$.

10. The device according to claim 1, wherein a resistance of the memory layer changes by an applied voltage.

11. The device according to claim 1, wherein a resistance of the memory layer changes due to a Joule heat generated by an applied voltage.

12. The device according to claim 1, wherein the memory layer includes at least one selected from the group consisting of C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, $ZnFe_xO_y$, $Ge_xSb_yTe_z$, N-doped $Ge_xSb_yTe_z$, O-doped $Ge_xSb_yTe_z$, $Ge_xSb_y$, and $In_xGe_yTe_z$.

13. The device according to claim 1, wherein the stacked structure unit further includes:
a first conductive layer provided on the memory layer on the rectifying element side; and
a second conductive layer provided on the memory layer on a side opposite to the first conductive layer, and
at least one of the first conductive layer and the second conductive layer includes at least one selected from the group consisting of tungsten nitride, titanium nitride, titanium aluminum nitride, tantalum nitride, titanium silicide nitride, tantalum carbide, titanium silicide, tungsten silicide, cobalt silicide, nickel silicide, nickel platinum silicide, platinum, ruthenium, platinum-rhodium, and iridium.

14. A method for manufacturing a nonvolatile memory device, the device including a plurality of component memory layers multiply stacked on one another, the component memory layer including a first wiring, a second wiring provided non-parallel to the first wiring, and a stacked structure unit provided between the first wiring and the second wiring, the stacked structure unit including a memory layer and a rectifying element, the method comprising:
forming a first conductive film serving as the first wiring on a semiconductor substrate;
forming a memory layer film serving as the memory layer;
forming an electrode film serving as an electrode of the rectifying element;

forming an oxide semiconductor film serving as an oxide semiconductor of the rectifying element;

forming a second conductive film serving as the second wiring;

forming the first wiring by processing the first conductive film into a band configuration aligning in a first direction; and forming the second wiring by processing the second conductive film into a band configuration aligning in a second direction non-parallel to the first direction, at least one of the forming the first wiring and the forming the second wiring processing the memory layer film, the electrode film, and the oxide semiconductor film into a configuration along one of the first wiring and the second wiring.

15. The method according to claim 14, wherein:

the forming the first wiring processes the memory layer film, the electrode film, and the oxide semiconductor film into a configuration along the first wiring;

the forming the second wiring processes the memory layer film, the electrode film, and the oxide semiconductor film into a configuration along the second wiring; and the memory layer film, the electrode film, and the oxide semiconductor film are processed into a columnar configuration by the forming the first wiring and the forming the second wiring.

16. The method according to claim 14, wherein the forming the first wiring processes the memory layer film and the electrode film into a configuration along the first wiring, and the forming the second wiring processes the memory layer film, the electrode film, and the oxide semiconductor film into a configuration along the second wiring, and processes the oxide semiconductor film into a band configuration along the second wiring while processing the memory layer and the electrode film into a columnar configuration.

17. A method for manufacturing a nonvolatile memory device, the device including a plurality of component memory layers multiply stacked on one another, the component memory layer including a first wiring, a second wiring provided non-parallel to the first wiring, and a stacked structure unit provided between the first wiring and the second wiring, the stacked structure unit including a memory layer and a rectifying element, the method comprising:

forming a first dielectric film having a first trench provided on a semiconductor substrate and filling a first conductive film into the first trench, the first conductive film serving as the first wiring;

forming a memory layer film serving as the memory layer;

forming an electrode film serving as an electrode of the rectifying element, and an oxide semiconductor film serving as an oxide semiconductor of the rectifying element;

collectively processing the memory layer film, the electrode film, and the oxide semiconductor film into a columnar configuration; and filling an inter-layer dielectric film between the memory layer film, the electrode film, and the oxide semiconductor film being collectively processed, forming a second dielectric film having a second trench above the memory layer film, the electrode film, the oxide semiconductor film, and the inter-layer dielectric film, and filling a second conductive film into the second trench, the second conductive film serving as the second wiring.

18. The device according to claim 5, wherein the electrode includes at least one selected from the group consisting of an oxide, a nitride, a silicide, and a carbide of the metal included in the electrode.

19. The device according to claim 1, wherein the rectifying element has a portion which has a band configuration and columnar configuration, and the oxide semiconductor has the band configuration.

* * * * *